(12) United States Patent
Sato

(10) Patent No.: US 6,392,945 B2
(45) Date of Patent: May 21, 2002

(54) SEMICONDUCTOR MEMORY DEVICE

(75) Inventor: Akira Sato, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/769,547

(22) Filed: Jan. 25, 2001

(30) Foreign Application Priority Data

Jan. 31, 2000 (JP) ...................................... 2000-023393

(51) Int. Cl.$^7$ ................................................ G11C 7/02
(52) U.S. Cl. ......................... 365/214; 365/200; 365/225
(58) Field of Search .......................... 365/63, 200, 214, 365/225, 185.09, 212

(56) References Cited

U.S. PATENT DOCUMENTS

| 5,467,316 A | * | 11/1995 | Kim et al. ............. 365/230.06 |
| 5,708,599 A | * | 1/1998 | Sato et al. ................. 365/154 |
| 5,805,501 A | * | 9/1998 | Shiau et al. ........... 365/185.29 |
| 5,862,086 A | * | 1/1999 | Makimura et al. .......... 365/200 |

FOREIGN PATENT DOCUMENTS

| JP | 1-205794 | | 8/1989 |
| JP | 2-7286 | | 1/1990 |
| JP | 406224279 A | * | 8/1994 |

\* cited by examiner

Primary Examiner—Richard Elms
Assistant Examiner—Hien Nguyen
(74) Attorney, Agent, or Firm—Hutchins, Wheeler & Dittmar

(57) ABSTRACT

A semiconductor memory device is provided which enables faults in a word line to be redressed with almost no increase in chip size and which does not cause layout problems even in advanced miniaturization. A driver simultaneously drives four word lines. A memory cell connected to these word lines is selected by a selection transistor. Using wiring for connecting word lines, two adjacent word lines are connected at the far end as seen from the driver to form a loop. If a fault occurs at a location on a word line, the driver supplies a charge to the word line from the far end thereof to the fault location via the above wiring and the other word line. Therefore, the word potential at the far end past the fault location is at or above a memory cell threshold voltage, and the memory cell can be read correctly.

9 Claims, 12 Drawing Sheets

SEMICONDUCTOR MEMORY DEVICE

BACKGROUND OF THE INVENTION

1. Field of the Invention

The present invention relates to a semiconductor memory device such as ROM (read only memory) and RAM (random access memory). In particular, the present invention relates to techniques for a miniaturized semiconductor memory device to redress faults in word lines caused by leaks, broken connections and the like.

2. Description of the Related Art

It is well know that, in order to redress faults present within a memory cell array forming a semiconductor memory device and increase the yield, it is effective to form the memory cell array as a redundant structure.

An example of a redundant structure is one in which, in RAM and the like, lines (row lines and column lines) of spare memory cells are provided in advance inside the semiconductor memory device during the manufacturing process and, if it is discovered during the testing process that there are faults in the memory cell array, the faults are redressed by replacing the line containing the faults with the spare row line or column line.

However, it is not possible to employ a redundant structure such as that described above in mask ROM and the like. In mask ROM, because the memory cell data is programmed in the manufacturing process, as the locations where faults are generated are not discovered in advance during the manufacturing process, it is not possible to program spare lines in the manufacturing process. Namely, even if it is discovered afterwards in the testing process that there are faults in the memory cell array, it is not possible to replace the faulty portion with a spare line as it is with RAM.

Therefore, in mask ROM and the like, instead of providing spare lines, faults are redressed by error correction using ECC (error checking and correcting code). By performing this type of error correction, if the faults are of several bits size, error redress is possible without overly increasing the ECC bit number. Moreover, the more the ECC bit number is increased, the more bit number errors it is possible to correct. However, as increasing the ECC bit number is directly related to increased chip size, this is not preferable. Furthermore, naturally, because there is not an unlimited number of areas where ECC allocation is possible, when there is a large number of faulty memory cells, it is not possible to correct all errors. In such cases, it is necessary to discard chips whose faults were the object of correction measures as faulty chips, which results in a lower yield.

However, one of the reasons why many memory cells become faulty is because of minute leaks and broken connections arising on a word line as a result of malfunctions in the manufacturing process. Firstly, a description will be given of what happens when leaks occur on a word line, with reference made to FIGS. 11A to 11C. In FIG. 11A, it will be assumed that, in the ROM, a single driver 200 simultaneously drives four word lines $201_1$ to $201_4$. In the same diagram, a leak is shown as occurring at the point X on the word line $201_4$.

Here, the reason why a single driver is driving a plurality of word lines is because it is becoming difficult to provide a driver for each word line due to the continuing miniaturization of semiconductor memory devices. Namely, through miniaturization, because the size of the memory cells becomes smaller compared with the size of the driver, the trend is for the size of the driver to become relatively larger.

In ROM and the like, in particular, because a memory cell can be formed from a single transistor, the size of the driver becomes larger by that amount as compared with the size of the memory cell. Therefore, the problem arises that, if a driver is provided for each word line, the surface area increases. As a result, the structure in which a single driver is provided for a plurality of word lines is currently the most common one.

As is shown in FIG. 11A, when malfunctions arise due to various reasons in the manufacturing process, in some cases, it is equivalent to a high resistance resistive element being present between the ground and the word line $201_4$ on the substrate or the chip. In such cases, a leak occurs at the point X shown in FIG. 11A. Here, FIG. 11B shows an equivalent circuit corresponding to the structure shown in FIG. 11A, specifically, an equivalent circuit for when the driver 200 supplies a high level (hereinafter abbreviated to "H") is shown only for the word line $201_4$.

In FIG. 11B, the symbol Vi indicates the potential of the word line $201_4$ in the vicinity of the output end (namely, the end near the word line) of the driver 200; the symbol Vxb indicates the potential of the word line $201_4$ at the point X in FIG. 11A; the symbol Vb indicates the potential at the far end of the word line $201_4$ as seen from the driver 200; the symbol Ra indicates a resistive element corresponding to resistance values from the near end of the word line $201_4$ to the X point; the symbol Rb indicates a resistive element corresponding to resistance values from the X point to the far end of the word line $201_4$; and the symbol Rx indicates a resistive element corresponding to resistance values from the X point to the substrate (or ground wiring).

FIG. 11C shows the relationship between the potential on the word line and the distance (horizontal axis) taking the output end of the driver 200 as a reference with attention centering on the word line $201_4$. Here, when memory data is read from a memory cell, the memory cell that is being read is turned on or off (referred to below as "on cells" and "off cells") in accordance with the memory data, and from that it is determined whether or not current is flowing through the bit line. Here, a bit line is also called a digit line or a data line. As a result, it is possible to determine the data stored in the relevant memory cell. In order to do this, it is necessary to set the word line potential supplied to the gate terminal of the cell transistor forming the memory cell to the necessary level (namely, to the threshold voltage of the cell transistor) or higher. The "Vt of On cell" shown in FIG. 11C represents this threshold voltage.

As is shown in FIG. 11C, the potential of the word line $201_4$ from the vicinity of the Xt point (omitted from FIG. 11B) positioned nearer the driver 200 than is the X point is less than the "Vt of On cell" due to the effects of the leakage problems at the X point in FIG. 11A. Moreover, beyond (i.e. towards the far end side) the Xt point as well, the potential of the word line $201_4$ continues to fall up to the X point. At the X point in FIG. 11A, the potential of the word line $201_4$ changes to the potential Vxb, and at the far end of the word line $201_4$, the potential of the word line $201_4$ changes to the potential Vb which is substantially equivalent to the potential Vxb.

In this way, the gate potentials of the cell transistors forming each memory cell connected to the word line $201_4$ do not reach the threshold value on the far end side of the Xt point. Therefore, these memory cells end up being always off which results in it being impossible to read of all of these memory cells. As described above, even if only a very minute leak occurs in a word line, reading of all of the memory cells towards the far end side of the location where the leak occurs becomes impossible. Accordingly, if the leak occurs at the near end of the word line, then all of the memory cells connected to that word line end up becoming unreadable.

Next, a description will be given of what happens when a broken connection occurs on a word line with reference made to FIGS. 12A to 12C. In these figures, the same elements as shown in FIGS. 11A to 11C are shown when a broken connection has occurred. Accordingly, in FIGS. 12A to 12C, the same structural elements and signal names as were shown in FIGS. 11A to 11C have the same descriptive symbols allocated thereto.

In FIG. 12A, it will be assumed that a broken connection has occurred at the point X on the word line $201_4$. As a result, the potential on the word line is sufficiently high compared to the "Vt of On cell" as far as the Xu point which is slightly closer to the near end side than the X point, moreover, the potential on the word line is substantially fixed. However, no potential is able to be supplied on the far end side of the X point which is where the broken connection has occurred. Therefore, the far end side of the Xu point shown in FIG. 12C becomes completely independent and floating, as is shown in FIG. 12B and the potential of the word line cannot be set. Therefore, the Xu point becomes a boundary with the potential of the word line dropping abruptly on the far end side thereof and falling far short of the "Vt of On cell". Accordingly, in the same way as when a leak occurs on the word line, if a broken connection occurs on a word line, reading of all of the memory cells connected to the word line on the far end side of the location of the broken connection becomes impossible.

As described above, if malfunctions such as leaks and broken connections occur, even if the actual memory cell itself is not faulty, reading of the memory cell on the far end side from the location of the malfunction is not possible.

It should be noted that the bit width of one byte of data output from the semiconductor memory device is normally one of 8, 16, 32, or 64 bits and this data is read from a plurality of memory cells connected to the same word line. Therefore, if malfunctions such as those described above occur, the number of bits that cannot be read contained in one byte increases and, even if error correction using ECC is performed, the possibility that the faults will not be able to be redressed increases. In cases such as this, the chip itself becomes unusable.

Here, an EEPROM (electrically erasable and programmable ROM) disclosed in Japanese Unexamined Patent Application, First Publication No. Hei 1-205794 may be given as an example of a semiconductor memory device for dealing with word line faults using ECC. This publication describes how, in order to make correction even of word line faults possible using ECC, the word line is divided and a high voltage switch (a type of buffer) is provided for raising the word line potential in each of the divided lines. By using this type of structure, even if there are several leaks in a word line, it is possible to limit the faulty memory cell to one bit and to perform correction using ECC. However, as described above, the miniaturization of semiconductor memory devices has progressed in recent times and the spaces required for providing a buffer no longer exists. Consequently, the providing of a plurality of buffers, as described in the above publication, can no longer be said to be a viable practical solution.

Note that, problems with conventional semiconductor memory devices related to ROM have been pointed out, however, the same type of problems occur in semiconductor memory devices other than ROM. Namely, if malfunctions caused by leaks and broken connections occur in a word line in RAM or the like, then the exact same problem occurs of it not being possible to read memory cells connected to the word line on the far end side of the location of the malfunction. To be sure, in the case of RAM and the like, it is possible to deal with faults in the word line by providing lines of spare memory cells, however, if it were possible to redress faults without having to use such spare lines, the size of the chip could then be reduced by the corresponding spare line amount.

SUMMARY OF THE INVENTION

Accordingly, the aim of the present invention is to provide a semiconductor memory device capable of redressing faults, when faults such as leaks and broken connections occur in a word line, substantially without increasing the chip size and without generating layout problems such as the placement of a driver being made more difficult due to increasing miniaturization.

Therefore, in the present invention, the drive section folds back a drive signal supplied to a particular word line to at least one other word line at the far end side of the particular word line as seen from the drive section. As a result, even if faults such as leaks or broken connections occur on a particular word line caused by malfunctions during manufacturing, a drive signal is supplied from the output end of the drive section to the location of the fault by a particular word line and a drive signal is supplied from the far end of a particular word line to the location of the fault via another word line and a folding section. In semiconductor memory devices in the related art, the potential from the location of the fault to the far end of a particular word line falls due to the fault in the word line, however, because it is possible to compensate for this fall in voltage according to the present invention, it is possible to guarantee that the voltage supplied to all of the memory cells connected to a particular word line will be above a threshold voltage. Therefore, the above fault in the word line can be redressed and an increase in the yield achieved.

Moreover, in the present invention, it is possible to connect by folding using wires any one word line and other word line and to form these wires and both these word lines in the same wire layer. As a result, because it is possible to redress faults in the word line without providing extra contact, it is possible to reduce the surface area required for the wires compared with when contact or the like is provided. Moreover, other than the folding section, because originally existing word lines are diverted, basically, it amounts to no more than adding a short length of wiring in order to make a connection between word lines. Accordingly, it is possible to keep the increase in the surface area that is needed to redress the faults in the word line as small as possible.

Further, in the present invention, it is also possible to arrange a plurality of word lines that are connected in a loop configuration in a concentric pattern. If this is done, it is possible to arrange the wiring such that this plurality of word line loops do not intersect each other. If the plurality of word line loops are made to temporarily intersect each other, another wiring layer needs to be provided, however, if this is done, then contact becomes necessary. In contrast to this, by forming a concentric pattern, contact and the like is not required thereby allowing the surface area to be correspondingly reduced.

Moreover, in the present invention, when there is an error in the original data, it is possible to correct this error using error correction codes and output error free data to the outside. Even if an error correction function is provided in a semiconductor memory device which is incapable of forming memory cells in redundant structures, when a plurality of memory cells have been rendered faulty due to a fault in a word line, it is not possible to perform a full correction using error correction codes. Therefore, the end result is that the chip has to be discarded. In contrast to this, according to the present invention, even in a semiconductor memory device that is incapable of forming memory cells in redundant structures, it is possible to redress faults in a number of memory cells that are caused by faults in a word line and to thereby achieve an improvement in the yield.

Furthermore, in the present invention, when a plurality of memory cells are driven simultaneously by the same drive signal, it is also possible to fold the drive signals so that they do not intersect selection signals for selecting a particular memory cell. As a result, because it is possible to place the wiring for the selection signal and the drive signal on the same wiring layer, contact and the like is not required as compared with when the selection signals and drive signals are intersected, thereby allowing the surface area to be correspondingly reduced.

Moreover, in the present invention, it is also possible to provide drive signals that are inverted relative to each other for a particular word line and for other word line, and also to invert the drive signal when a drive signal is folded from the particular word line to another word line. As a result of this, it is possible to redress faults in the word line and achieve an improvement in the yield even for DRAM and the like which are not allowed to simultaneously activate a plurality of word lines.

BRIEF DESCRIPTION OF THE DRAWINGS

FIG. 1A is an explanatory diagram showing the wiring between word lines driven simultaneously by a single driver; FIG. 1B is a circuit diagram showing an equivalent circuit corresponding to the structure shown in FIG. 1A; and FIG. 1C is a graph showing a comparison between the present invention and the related art concerning the relationship between the distance from the driver output end and word line potential.

FIG. 2A is an explanatory diagram showing the wiring between word lines driven simultaneously by a single driver; FIG. 2B is a circuit diagram showing an equivalent circuit corresponding to the structure shown in FIG. 2A; and FIG. 2C is a graph showing a comparison between the present invention and the related art concerning the relationship between the distance from the driver output end and word line potential.

FIG. 11A is an explanatory diagram showing the wiring between word lines driven simultaneously by a single driver; FIG. 11B is a circuit diagram showing an equivalent circuit corresponding to the structure shown in FIG. 11A; and FIG. 11C is a graph showing the relationship between the distance from the driver output end and word line potential.

FIG. 12A is an explanatory diagram showing the wiring between word lines driven simultaneously by a single driver; FIG. 12B is a circuit diagram showing an equivalent circuit corresponding to the structure shown in FIG. 12A; and FIG. 12C is a graph showing the relationship between the distance from the driver output end and word line potential.

DETAILED DESCRIPTION OF THE PREFERRED EMBODIMENTS (Basic Technological Concept)

The embodiments of the present invention will now be described with reference made to the drawings. Here, firstly, a description will be given of the basic technological concept of the present invention and after that a series of descriptions will be given of each of the embodiments in which the present invention is applied to various types of semiconductor memory devices.

As described above, in a semiconductor memory device of the related art, the path of the supply of an electric charge from a driver to a word line is in the one direction from the near end to the far end. Therefore, if there are faults in the word line, the potential of the word line on the far end side of the location of the fault drops and the potential supplied to the gate terminal of the memory cell also decreases and falls below a threshold value of the memory cell. Therefore, if the memory cell is an on cell, current could be expected to be flowing to the memory cell, however, because the gate potential is low, the current is unable to flow and the memory cell cannot be recognized as an on cell. Therefore, in the present invention, a structure is used in which electric charges are supplied to each portion of a word line via a plurality of paths.

(1) When the word fault is a leak

Figure 1A:
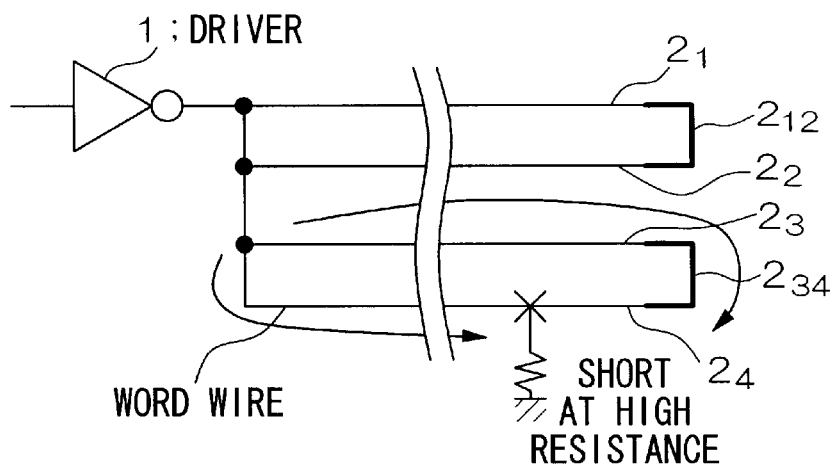
FIGS. 1A to 1C show the basic technological concept of the present invention in the case of when a leak has occurred on a word line.
Figure 1B:
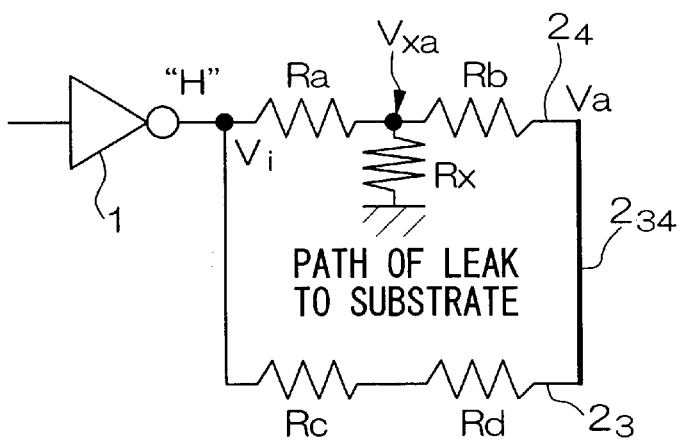
Figure 1C:
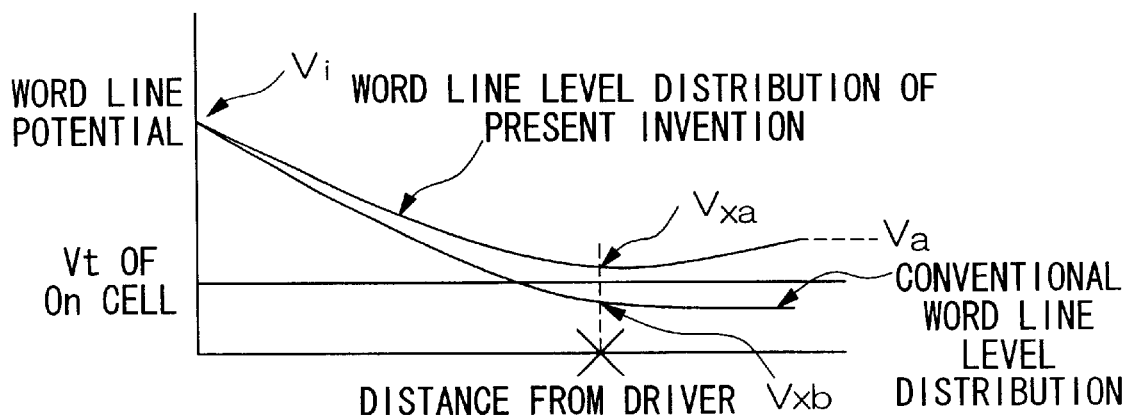
Figure 11A:
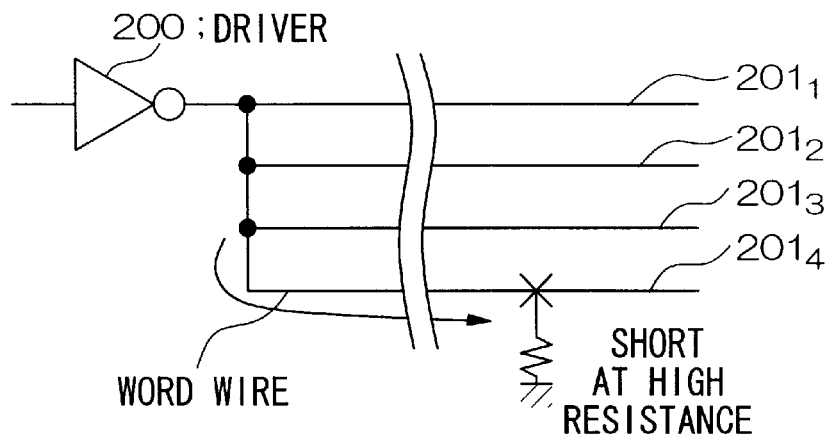
FIGS. 11A to 11C show when a leak has occurred on a word line in ROM according to the related art.
Figure 11B:
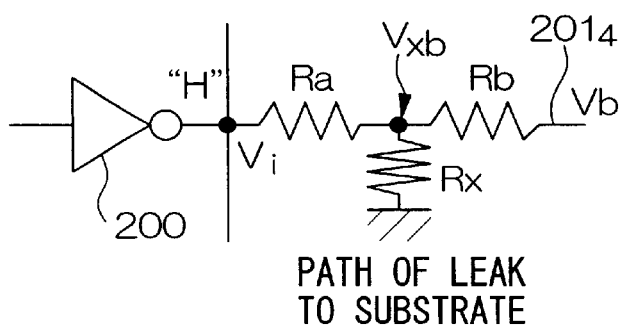
Figure 11C:
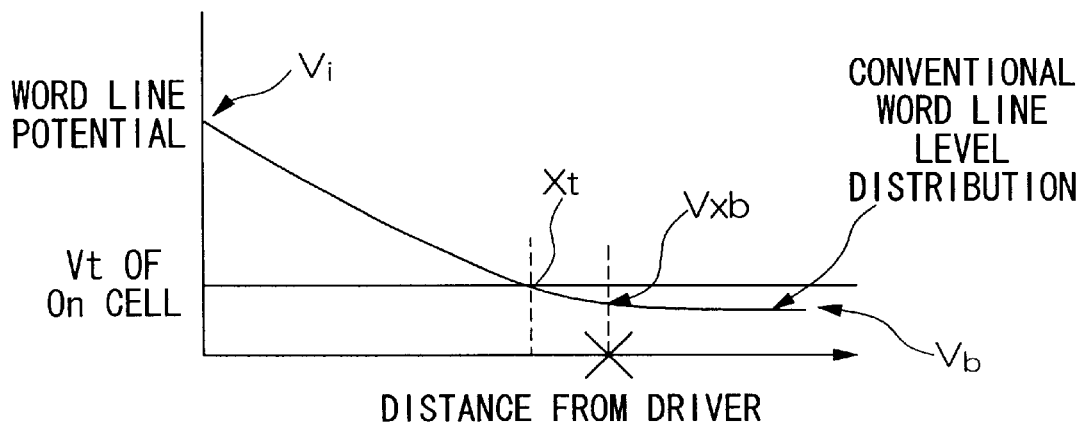

FIGS. 1A to 1C show an example of the present invention when a leak occurs on a word line in the same way as the aforementioned FIGS. 11A to 11C. FIGS. 1A to 1C correspond to FIGS. 11A to 11C respectively. As is shown in FIG. 1A, a driver 1 simultaneously drives four word lines $2_1$ to $2_4$. In the present invention, two word lines of the word lines driven by the same driver are taken as one unit and the far ends thereof are connected together to form a loop configuration. Specifically, the far end of the word line $2_1$ and the far end of the word line $2_2$ are connected by the wire $2_{12}$, while the far end of the word line $2_3$ and the far end of the word line $2_4$ are connected by the wire $2_{34}$.

By using the above structure, it is possible to provide redress for memory cells connected to a word line on the far end side of the location where the leak has occurred. For example, if it is assumed that a leak has occurred at the point X on the word line $2_4$, in the structure of the related art, a charge cannot be supplied between the area in front of the X point to the far end of the word line because of the effects of the leak and reading of the memory cell is not possible. In contrast, in the present invention, a charge can be supplied to the word line $2_4$ from the far end side of the word line $2_4$ via the word line $2_3$ and the wire $2_{34}$. Namely, in a semiconductor memory device of the related art, it is only possible to provide a charge by one system, while in the present invention, it is possible to supply a charge via a plurality of systems (two systems in the illustrated structural example). Therefore, it is possible to apply a voltage equal to or greater than the threshold voltage to the gate terminal of a cell transistor even in the area of the point X where the leak has occurred.

Note that, because the word lines $2_1$ to $2_4$ are originally formed so as to operate in exactly the same manner, connecting the word lines together causes no operational problems. Moreover, the number of word lines simultaneously driven by the driver 1 is not limited to four and may be any number of lines. Naturally, as in the structural example shown in FIG. 1A, when two word lines are connected as a unit, the number of word lines that are simultaneously driven by the driver 1 is an even number.

Next, FIG. 1B shows an equivalent circuit comprising the word line $2_3$, the wire $2_{34}$ and the word line $2_4$ shown in FIG. 1A, when the output of the driver 1 is "H". In FIG. 1B, the symbol Vi indicates the potential in the area of the output end of the driver 1; the symbol Vxa indicates the potential of the word line at the location of a fault (the point X in FIG. 1A); the symbol Va indicates the potential at the far end (i.e. at the wire $2_{34}$) of the word lines; the symbol Ra indicates a resistive element corresponding to the resistance value from the output end of the driver 1 to the point X; the symbol Rb indicates a resistive element corresponding to the resistance value from the point X to the far end of the word line; and the symbol Rx indicates a resistive element corresponding to the resistance value from the point X to the substrate (or ground). The symbols Rc and Rd indicate resistive elements on the word line $2_3$ corresponding respectively to the resistive elements Ra and Rb on the word line $2_4$.

Here, a comparison will be given of the potential at the location of a leak for both the structure of the related art and an example of the structure of the present invention. Firstly, in the structure of the related art, the potential Vxb from the equivalent circuit shown in FIG. 11B is given from the following formula.

$$Vxb=Rx\times Vi/(Ra+Rx)$$

In the example of the structure of the present invention, however, the potential Vxa from the equivalent circuit shown in FIG. 1B is given from the following formula. Note that, in the formula, the calculation symbol "//" is defined as $X//Y \equiv X \times Y/(X+Y)$.

$$Vxa=Rx\times Vi/\{(Rb+Rc+Rd)//Ra+Rx\}$$

Because it is obvious that (Rb+Rc+Rd)//Ra<Ra, the relationship Vxa>Vxb is established. Namely, it is possible to increase the potential at the location of the leak using the structural example of the present invention more than in the structure of the related art. Moreover, as is clear from FIG. 11B, because there is no current flowing in the resistive element Rb, the potential Vb≈the potential Vxb. In contrast, in the structural example of the present invention, because a charge is supplied to the word line $2_4$ via the word line $2_3$ and the wire $2_{34}$, the potential Va is a higher potential than the potential Vxa.

Next, FIG. 1C shows the relationship between the word line potential and the distance when the output end of the driver 1 is taken as a reference for the word line $2_4$, and also shows the word line level distribution according to the structure of the related art shown in FIG. 11C. According to the structural example of the present invention, the potential on the word line $2_4$ at the output end of the driver 1 is the potential Vi and this potential steadily decreases the closer to the point X. Although the potential on the word line $2_4$ becomes the minimum value potential Vxa at the point X, this potential exceeds the "Vt of On cell". Moreover, the potential on the word line $2_4$ steadily increases the closer to the far end from the point X and becomes the potential Va at the far end of the word line $2_4$.

In this way, in the structural example of the present invention, a charge is supplied from the driver 1 heading towards the location of the leak in both the direction of the near end side of the word line and in the direction of the far end side of the word line. Therefore, it is possible to increase the overall potential of the word line in which a leak occurs more than in the structure of the related art, and to guarantee that the potential over the entire word line is equal to or greater than the "Vt of On cell". In the structure of the related art, it is not possible to read memory cells that exist on the far end side of the point Xt (see FIG. 11C), however, according to the structural example of the present invention, because it is possible for all memory cells to be read, the chip does not need to be discarded and an improvement in the yield can be anticipated.

(2) When the word fault is a broken connection

Figure 2A:
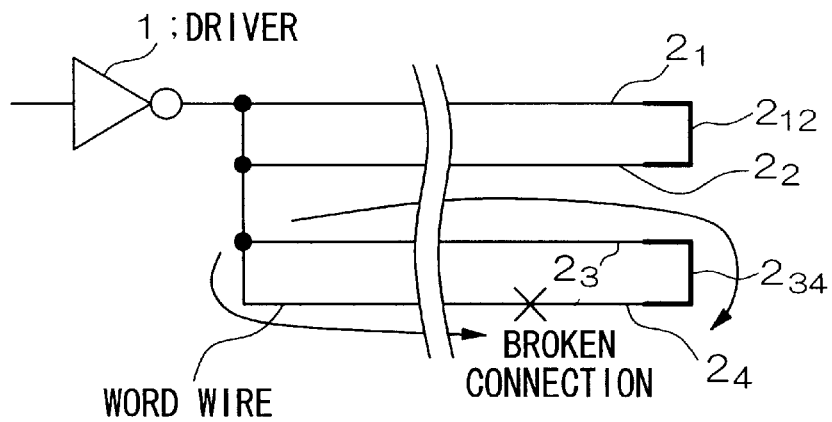
FIGS. 2A to 2C show the basic technological concept of the present invention in the case of when a broken connection has occurred on a word line.
Figure 2B:
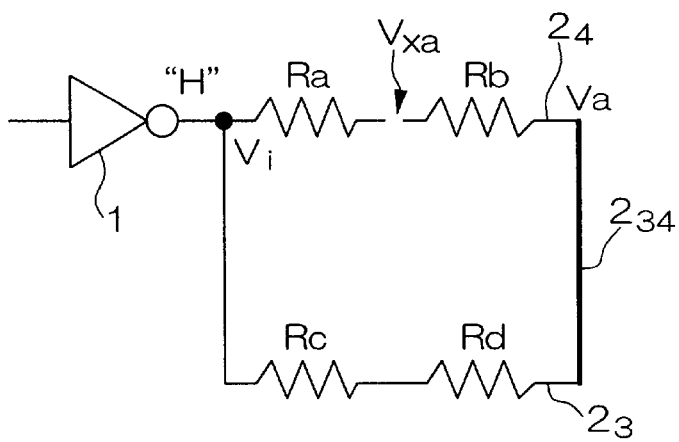
Figure 2C:
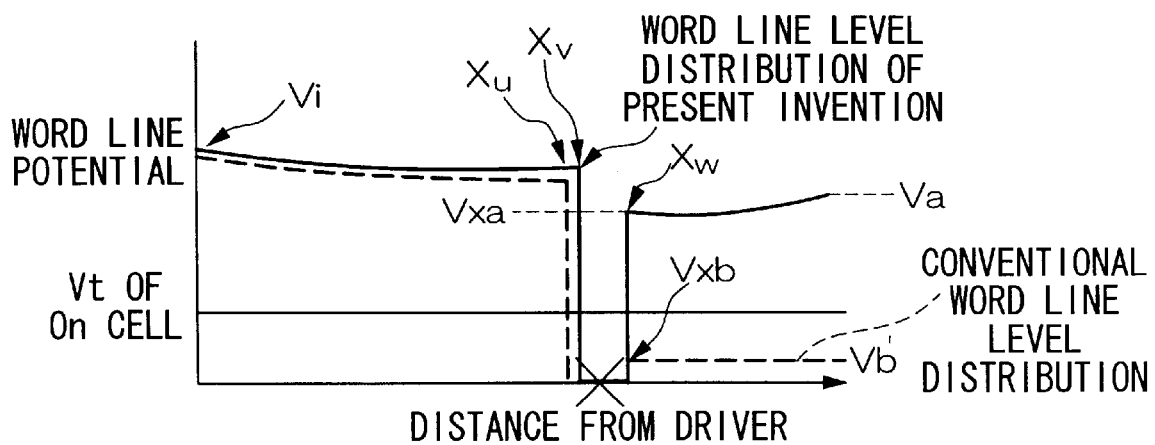
Figure 12A:
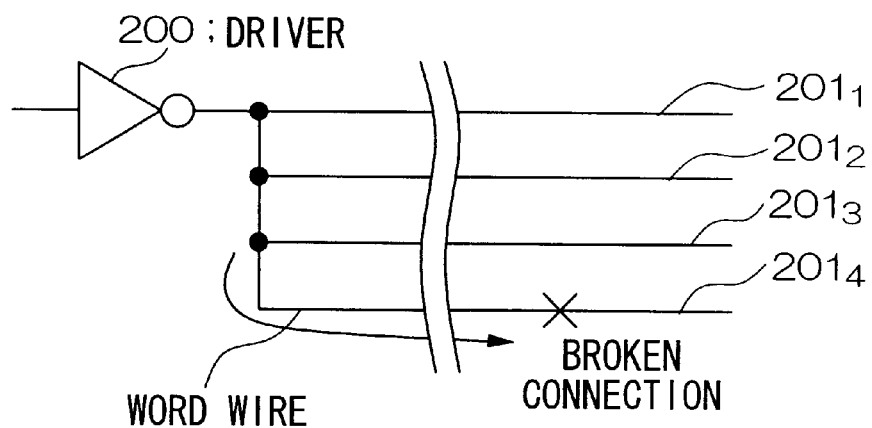
FIGS. 12A to 12C show when a broken connection has occurred on a word line in ROM according to the related art.
Figure 12B:
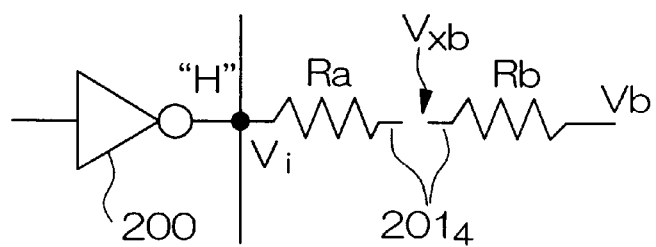
Figure 12C:
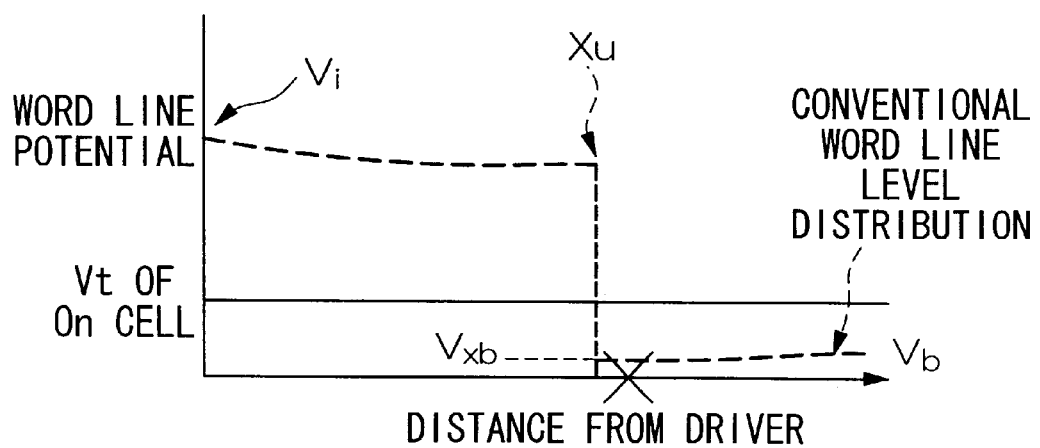

FIGS. 2A to 2C show an example of the present invention when a broken connection occurs on a word line in the same way as the aforementioned FIGS. 12A to 12C. FIGS. 2A to 2C correspond to FIGS. 12A to 12C respectively. In FIG. 2A, because a broken connection has occurred at the point X on the word line $2_4$, in the same way as in FIG. 12A, no charge is supplied from the left side towards the right side bridging the point X. However, in this case, because a charge is supplied from the far end of the word line $2_4$ to the point X via the word line $2_3$ and the wire $2_{34}$, it is possible for all the memory cells connected to the word line $2_4$ to be read correctly.

Here, FIG. 2B shows an equivalent circuit comprising the word line $2_3$, the wire $2_{34}$ and the word line $2_4$ shown in FIG. 2A, when the output of the driver 1 is "H". The difference with the fault in the word line caused by a leak (see FIG. 1B) is that the connection point between the resistive element Ra and the resistive element Rb is broken, therefore, the resistive element Rx does not exist. Moreover, if the potential at the far end of the word line $2_4$ and the potential at the location of the broken connection in the structure of the related art and the structural example of the present invention are compared, then the following is discovered.

Firstly, in the structure of the related art, because the resistive element Rb is floating as is shown in the equivalent circuit in FIG. 12B, both the potential Vxb and the potential Vb are indefinite. In contrast, in the structural example of the present invention, there is practically no current flowing in each of the resistive elements Ra to Rd shown in FIG. 2B due to the broken connection and the potential Vxa and the potential Va can be determined from the following formula.

$$Vxa = Va \approx Vi$$

Namely, according to the structural example of the present invention, it is possible to supply substantially with no change the voltage output by the driver 1 to each memory cell connected to the word line $2_3$ and the word line $2_4$ other than the area in the location of the broken connection, and substantially all of the memory cells are able to be read. On the other hand, in the structure of the related art, because the gate potential of the memory cells on the far end side of the location of the broken connection is indefinite, it is not possible to perform an accurate reading for these memory cells.

Next, FIG. 2C shows the relationship between the word line potential and the distance when the output end of the driver 1 is taken as a reference for the word line $2_4$. In FIG. 2C, the distribution shown by the solid line is the word line level distribution according to the structural example of the present invention and the distribution shown by the broken line is the same as the word line level distribution of the related art shown in FIG. 12C. According to the structural example of the present invention, the potential from the near end of the driver 1 to the point Xv in front of the location of the broken connection (i.e. the point X) is substantially the same as the output voltage Vi of the driver 1 with only slight variations and this potential exceeds the "Vt of On cell". Moreover, although the potential as far as the far end from the point Xw slightly beyond the location of the broken connection towards the far end side also is slightly less than the potential from the output end of the driver 1 to the X point due to the effect of the voltage drop in the word line $2_3$, this potential also exceeds the "Vt of On cell".

Thus, in the present invention, even when a broken connection occurs, a charge is supplied to the location of the broken connection from the driver 1 both in the direction of the near end side of the word line and in the direction of the far end side of the word line. Therefore, apart from the extremely small area of the actual location of the broken connection, it is possible to increase the overall potential of the word line more than in the structure of the related art, and it is possible to make the potential of the entire word line equal to or greater than the "Vt of On cell". Accordingly, although in the structure of the related art, it is not possible to read memory cells that exist on the far end side of the point Xu (seed FIG. 12C), according to the structural example of the present invention, it is possible for almost all memory cells to be read and an improvement in the yield can be anticipated.

Note that, it is not absolutely necessary for two adjacent word lines to be connected, as is described above, and it is also possible, for example, to connect the word line $2_1$ and the word line $2_3$ and to connect the word line $2_2$ and the word line $2_4$. Naturally, by connecting adjacent word lines together, the total length of the wiring needed to be added to redress the faults in the word lines can be kept to the minimum which provides the advantage that the amount of the increase in the surface area can also be kept to the minimum.

Moreover, in the above description, the far ends of two word lines are connected together, however, it is also possible to connect together the far ends of three or more word lines. For example, one consideration might be to connect the wires $2_{12}$ and $2_{34}$ in FIG. 1A together with yet another wire so that the four word lines are all connected together. If this is done, even if there are faults in both the word line $2_1$ and the word line $2_2$, for example, it is possible to supply a charge as far as the location of the fault from the far end sides of the other remaining word lines $2_3$ and $2_4$, thereby enabling the yield to be increased.

First Embodiment (1) Overall Structure

Figure 3:
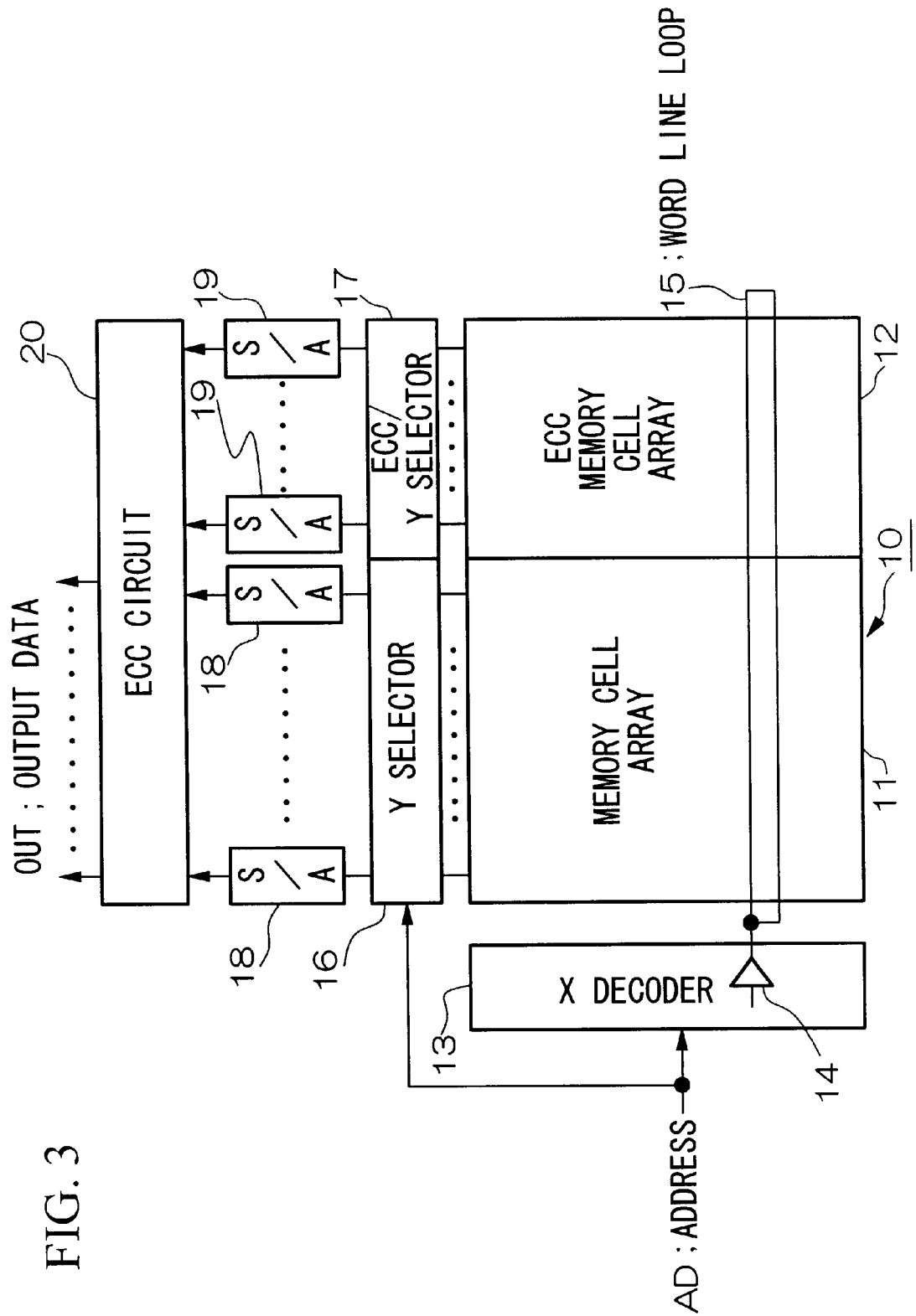
FIG. 3 is a block diagram showing the overall structure of ROM according to the first embodiment of the present invention.

The semiconductor memory device according to the present embodiment is one in which the present invention has been applied to ROM for performing error correction using ECC, and a block diagram of the overall structure thereof is shown in FIG. 3. In FIG. 3, the memory section 10 is formed from a memory cell array 11 in which is stored original data to be output to the outside of the ROM and from an ECC memory cell array 12 in which is stored the ECC used for correcting errors in the data.

An address AD supplied from outside the ROM comprises a row address used in the selection of a word line and a column address used in the selection of a bit line. An X decoder 13 contains in it drivers 14, . . . , 14 for driving the word lines and each driver 14 simultaneously drives n number (wherein n is an integer of 2 or more) of word lines in accordance with word line activation signals (these are not shown in FIG. 3). Note that, in FIG. 3, only one driver 14 is shown and, out of the n number of word lines connected to the drivers 14, only two adjacent word lines connected in a loop configuration are shown as the word line loop 15. Moreover, unlike the drivers 1 (the inverting drivers) shown in FIGS. 1A to 1C and 2A to 2C, the drivers 14 are non-inverting drivers that generate output signals without inverting the level of the input signal, but inverting drivers may also be used.

Here, when a reading is made from the memory section 10, it is necessary to read on the bit line only the data of a memory cell connected to a particular word line of the n number of word lines simultaneously driven. Therefore, the X decoder 13 decodes the row address and sets any one of the drivers into operation, and also generates a selection signal (which corresponds to the "bank selection signal" or "block selector" described below) for selecting the data of any one of the memory cells connected to the n number of word lines. This selection signal is supplied to a selection transistor (not shown in FIG. 3) in the memory section 10.

Next, a Y selector 16 selects the bit line that corresponds to the data (for example, 8 bit width data) to be simultaneously output to outside the ROM from among the plurality of bit lines within the memory cell array 11, based on the column addresses contained in the address AD. An ECC/Y selector 17 is the same and it selects a bit line for reading the ECC corresponding to the output data from among the plurality of bit lines within the ECC memory cell array 12.

Next, sense amplifiers 18, . . . , 18 (denoted as S/A in the diagram) are provided in a number corresponding to the bit width of the output data OUT, and these sense the memory cell data that is read out from the bit line corresponding to each sense amplifier and output data to be output. The sense amplifiers 19, . . . , 19 are the same and these sense the data on the bit lines selected by the ECC/Y selector 17 and output the ECC corresponding to the output data.

The ECC circuit 20 outputs output data OUT to the outside of the ROM via an output buffer (not illustrated) after any errors in the output data have been corrected based on the output data and ECC. If, however, there are no errors in the output data that arrives from the sense amplifiers 18, the ECC circuit 20 outputs this output data without alteration to the outside of the ROM as output data OUT. Moreover, when it is not possible to correct the output data, the ECC circuit 20 outputs error information indicating the fact that the data cannot be corrected from an output terminal (not illustrated) to an external memory controller and CPU (i.e. central processing unit) which are also not illustrated. Note that this error information is used for checking memories and for sorting chips.

(2) Connection Relationship between the Drivers 14 and the Memory Section 10

Figure 4:
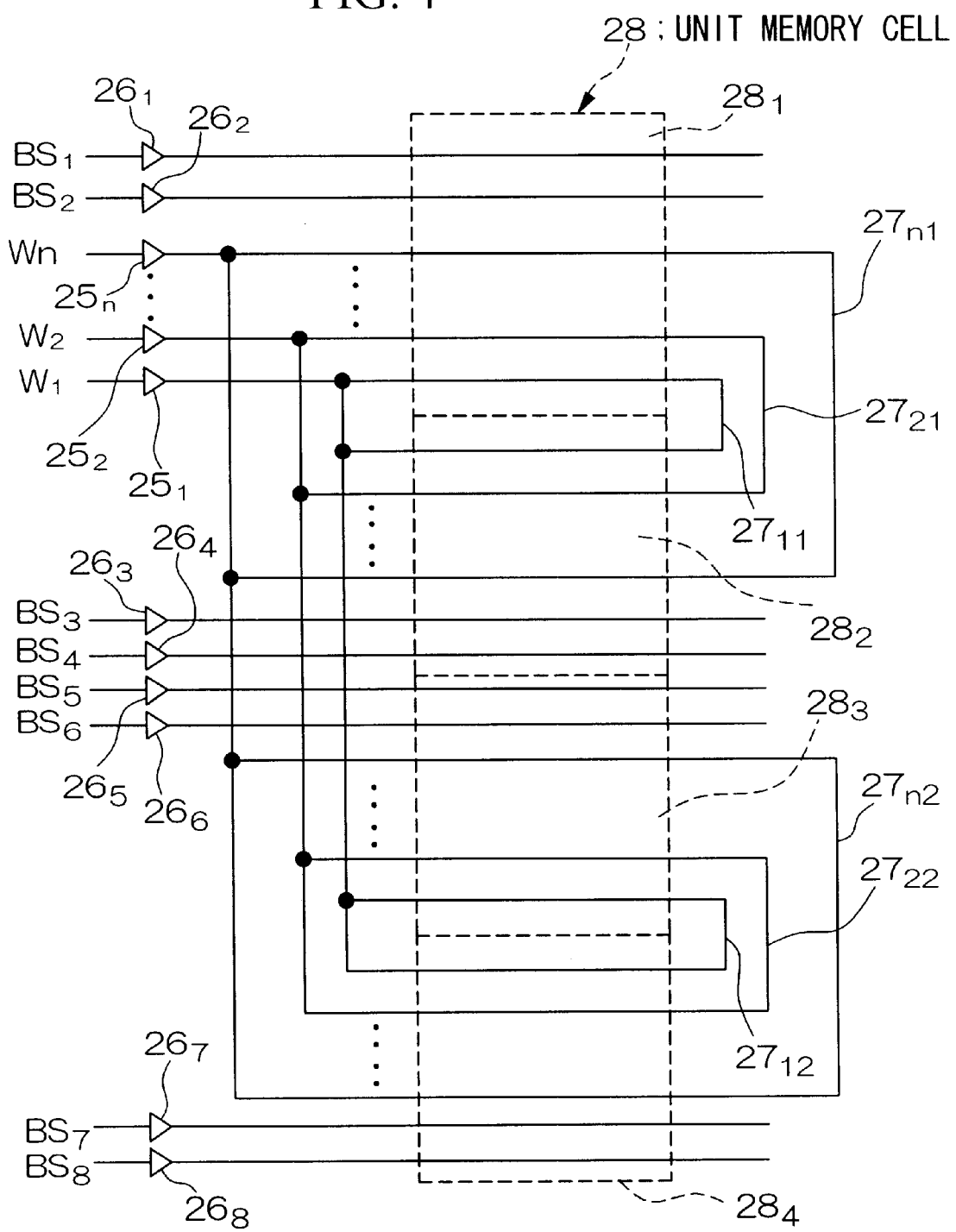
FIG. 4 is an explanatory diagram showing the relationship of the connections between the memory section 10 and the driver in the X decoder 13 shown in FIG. 3.

FIG. 4 shows in more detail selection signals and word line drive signals supplied to the memory section 10 from the drivers 14 that are shown in FIG. 3. Note that, the memory section 10 shown in FIG. 3 is formed from a plurality of the structures shown in FIG. 4 grouped together in the vertical direction of the diagram. Note also that, due to its complexity, all of the bit lines and memory cells are not illustrated in FIG. 4.

In FIG. 4, the symbols $W_1$ to $W_n$ indicate word line activation signals generated inside the X decoder 13 shown in FIG. 3, and are respectively supplied to the input ends of drivers $25_1$ to $25_n$. The drivers $25_1$ to $25_n$ correspond to the drivers 14 shown in FIG. 3 and each driver simultaneously drives four word lines as described above. The drivers $26_1$ to $26_8$ respectively buffer selection signals $BS_1$ to $BS_8$ described below and drive selection transistors (not illustrated in FIG. 4) within a unit memory cell 28.

Looking, for example, at the word line driven by the driver $25_1$, in the structure of the related art, all of the far ends of the four word lines were opened. In contrast to this, in the present embodiment, by connecting the far end sides of two adjacent word lines, a rectangular word line loop $27_{11}$ and a rectangular word line loop $27_{12}$ are formed and the word line loops are connected by wires in the vertical direction at the near end sides of the driver $25_1$. In the same way, the word lines simultaneously driven by the driver $25_2$ form a word line loop $27_{21}$ and a word line loop $27_{22}$.

The word line loop $27_{21}$ surrounds the word line loop $27_{11}$. These word line loops are both placed concentrically to each other. The same conditions apply to the other word lines and the word line loop $27_{n1}$ surrounds all of the word line loops $27_{11}$, $27_{21}$, . . . and these are all placed concentrically to each other. Furthermore, the word line loop $27_{n2}$ surrounds all the word line loops $27_{12}$, $27_{22}$, . . . and these word line loops are all placed concentrically to each other.

Here, the word line drive signals supplied to each word line within the unit memory cell 28 have the order $W_n, \ldots, W_2, W_1, W_1, W_2, \ldots, W_n, W_n, \ldots, W_2, W_1, W_1, W_2, \ldots, W_n$ from the top to the bottom in FIG. 4. By using this formation, as is shown in FIG. 4, when the far end sides of simultaneously driven adjacent word lines are connected, it is possible for them to be placed in a concentric configuration without the word line loops intersecting each other. As a result, because it is possible to place the wiring for each word line loop in a single wiring layer, no extra contact is needed and the area of the wiring can be decreased by a corresponding amount.

Figure 5:
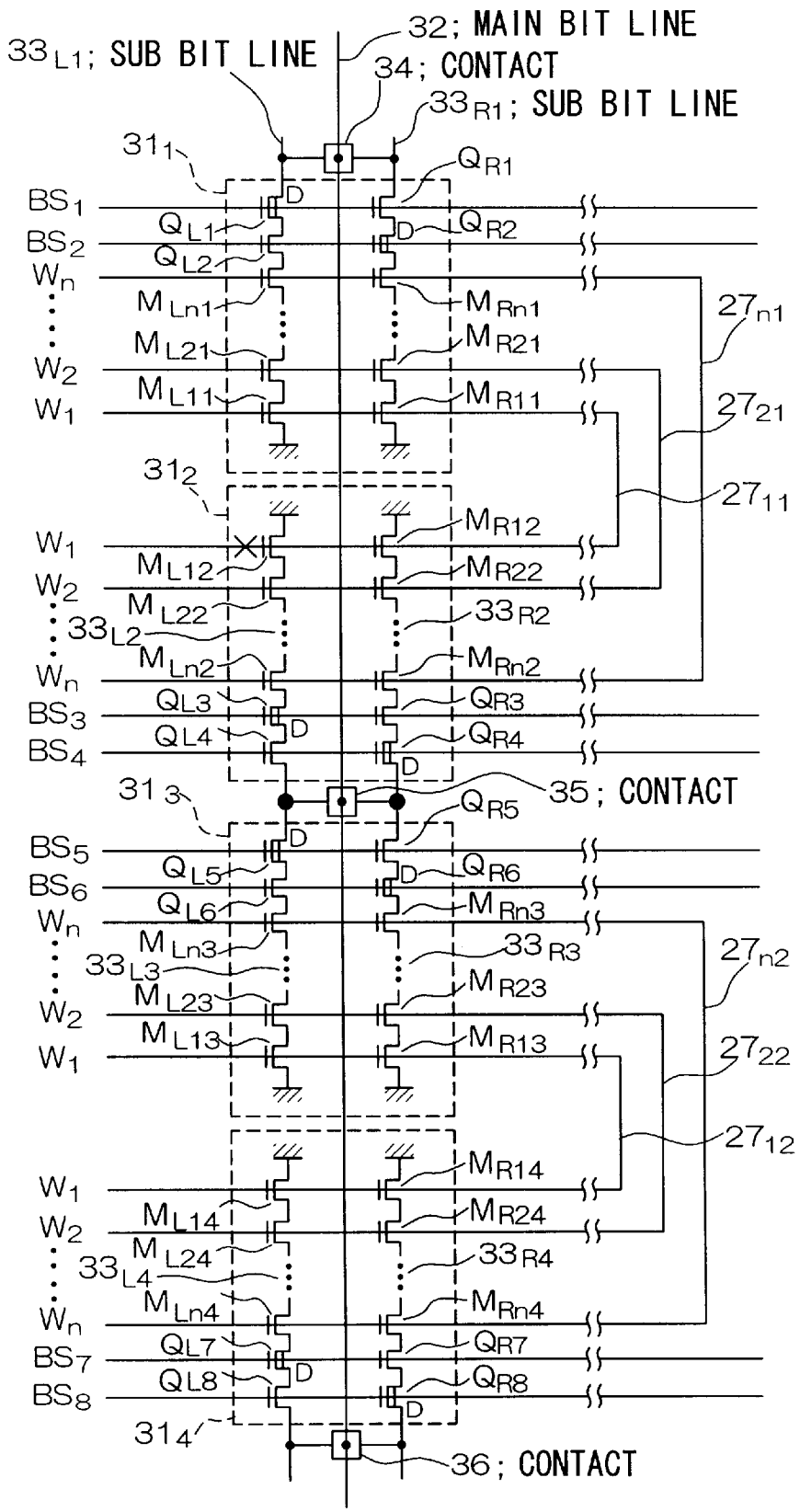
FIG. 5 is a circuit diagram showing the structure of a unit memory cell in the memory section 10 shown in FIG. 3 for a NAND type memory cell structure.
Figure 6:
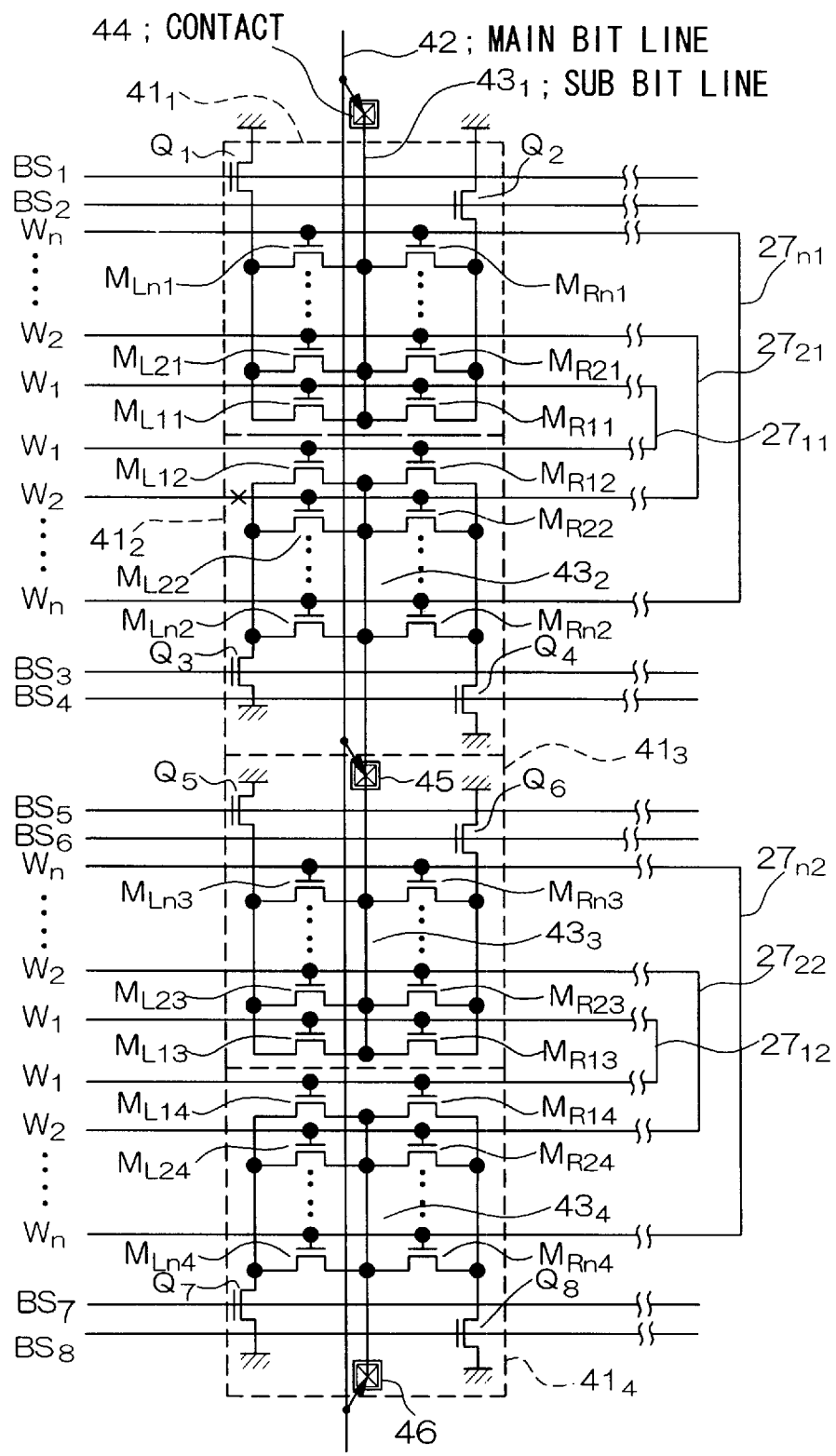
FIG. 6 is a circuit diagram showing the structure of a unit memory cell in the memory section 10 shown in FIG. 3 for a NOR type memory cell structure.

Next, the symbol 28 indicates a unit memory cell comprising, for example, NAND (inverted AND) type memory cells or NOR (inverted OR) type memory cells and is formed from 8×n number of memory cells. By activating any one of word line activation signals $W_1$ to $W_n$, the eight memory cells corresponding to the activated word line activation signals are selected in the unit memory cell 28. Note that, as is also shown in FIGS. 5 and 6 below, the unit memory cell 28 is formed by grouping together four "blocks" or "banks" to which two selection signals and n number of word line activation signals are supplied.

Here, the X decoder 13 shown in FIG. 3 is formed from one predecoder that predecodes the addresses AD and a plurality of main decoders that further decode the output from the predecoder. A unit memory cell 28 is provided to correspond to each of these main decoders. Accordingly, the unit memory cell 28 shown in FIG. 4 can be called a "decode unit block". Note that the specific structure of the unit memory cell 28 will be described below in detail with reference to FIGS. 5 and 6.

Next, the selection signals $BS_1$ to $BS_8$ are generally called bank selection signals or block selectors. As described above, if any one of the word line activation signals $W_1$ to $W_n$ is validated, the eight memory cells connected to the four word lines (namely, the two groups of word line loops) driven by the driver corresponding to the word line activation signal are simultaneously selected within the unit memory cell 28. As a result of this, one of the selection signals $BS_1$ to $BS_8$ is validated and a single memory cell only is selected from among the eight memory cells simultaneously selected.

Note that, to select a unit memory cell other than the illustrated unit memory cell, in order to invalidate all of the selection signals $BS_1$ to $BS_8$ supplied to the unit memory cell 28, they are all set to low level (abbreviated below to "L"). Moreover, selection signals and word line activation signals that are different to the selection signals $BS_1$ to $BS_8$ and to the word line activation signals $W_1$ to $W_n$ shown in FIG. 4 are supplied to the unit memory cell other than the illustrated unit memory cell.

Further, as a structure other than the illustrated structure, it is also possible, for example, to form word line loops such that they bridge the selection signals $BS_3$ to $BS_6$. However, if this structure is employed, a separate wiring layer from the word lines must be used for the wiring that bridges the selection signals. Contact must then be provided for this and the surface area increases correspondingly. Accordingly, as is shown in FIG. 4, it is desirable that a word line loop be formed within two adjacent blocks without the selection signals being bridged. Using this structure, not only is it possible to form word line loops on the same wiring layer without using contact, but the length of the wiring needed to fold back the word line at the far end side can be reduced to the minimum and the optimum arrangement in which the surface area required for the wiring is at the minimum is made possible.

(3) NAND Type Memory Cells

Next, two types of structural examples will be described as specific structures for the unit memory cell 28. Firstly, FIG. 5 shows ROM that employs a NAND type memory cell structure in which memory cells are vertically stacked. Note that, in FIG. 5, only the unit memory cell and the word line have been extracted and illustrated, and only the structure relating to one bit line within the unit memory cell is shown. Moreover, in FIG. 5, all of the drivers $25_1$ to $25_n$ and $26_1$ to $26_8$ shown in FIG. 4 have been omitted.

Here, as described above, a unit memory cell is divided into four adjacent blocks $31_1$ to $31_4$. Looking first at the area of the block $31_1$, each bit line is formed from a main bit line 32 and two sub bit lines $33_{L1}$ and $33_{R1}$ connected to the main bit line 32. Depending on which of the memory cell array 11 and the ECC memory cell array 12 the main bit line 32 is present in, the top end of the main bit line 32 is connected to one of the Y selector 16 or the ECC/Y selector 17. Note that the wiring of the main bit line 32 mainly uses an aluminum wiring layer and the sub bit lines $33_{L1}$ and $33_{R1}$ are mainly formed from a diffused layer.

Next, the symbol 34 indicates a contact between the aluminum wiring layer and the diffused layer for connecting the main bit line 32 and the sub bit lines $33_{L1}$ and $33_{R1}$. The contacts 35 and 36 are the same as this contact 34. Other than these, only gate polycide wiring is used for the wiring of the word line loops such as the word line loop $27_{11}$ and for the block selection wires supplying the selection signals $BS_1$ to $BS_8$. Note that, in order to reduce the manufacturing costs of the ROM compared to the RAM and the like, it is normal for one each of both the aluminum and polycide wiring layers to be provided.

Next, in the block $31_1$, looking first at the sub bit line $33_{L1}$, nMOS (metal oxide semiconductor) transistors forming the respective memory cells $M_{Ln1}, \ldots, M_{L21}, M_{L11}$ and the transistors (abbreviated below to Tr) $Q_{L1}$, $TrQ_{L2}$ are placed in a vertical stack between the contact 34 and the ground. Note that, in order to create the data of (program) these memory cells, in accordance with the data to be programmed, it is sufficient if a decision is made as to whether or not the cell transistor should be placed in a constantly on state. In this case, in order to place the cell transistor in a constantly on state, impurities in the cell transistor may undergo ion implantation thereby forming a depletion type transistor.

$TrQ_{L1}$ indicates a depletion type nMOS transistor. Accordingly, although the selection signal $BS_1$ is connected to the gate terminal thereof, the $TrQ_{L1}$ is constantly on regardless of the level of the selection signal $BS_1$ and is not directly connected with the operation. Note that the reason for employing this type of structure is so that number of bit lines and the number of contacts can be reduced in comparison with the related art and so as to integrate the word line directions (the X axis direction). Moreover, in FIG. 5, the symbol "D" is given to relevant transistors so that it can be immediately seen that the transistor is a depletion type transistor. Accordingly, those transistors that do not have the symbol D (other than cell transistors) are all enhancement type nMOS transistors. This fact is the same for all diagrams referred to below.

Next, $TrQ_{L2}$ indicates a selection transistor used for block selection. Namely, by setting the selection signal $BS_2$ to "H" and placing the $TrQ_{L2}$ in an on state, the memory cells $M_{Ln1} \ldots, M_{L21}, M_{L11}$ connected to the sub bit line $33_{L1}$ are able to be read on the main bit line 32. Note that word line activation signals $W_1$ to $W_n$ for selecting the respective memory cells are supplied to the gate terminals of the memory cells $M_{L11}$ to $M_{Ln1}$.

The structure of the sub bit line $33_{R1}$ side is the same as that of the sub bit line $33_{L1}$ side apart from the following points. Firstly, the $TrQ_{R1}$ to which the selection signal $BS_1$ is supplied is set as an enhancement type selection transistor and the $TrQ_{R2}$ to which the selection signal $BS_2$ is supplied is set as a depletion type transistor so that the memory cells on the sub bit line $33_{R1}$ and the memory cells on the sub bit line $33_{L1}$ are not read simultaneously. Therefore, by setting the selection signal $BS_1$ to "H", it is possible to read the data of the memory cells $M_{R11}$ to $M_{Rn1}$ on the main bit line 32.

The structure of the block $31_2$ is the same as that of the block $31_1$. Namely, the structure of the block $31_1$ is made mirror symmetrical using a straight line parallel to the word line as the axis of symmetry, and the block $31_2$ is formed by supplying the selection signals $BS_3$ and $BS_4$ instead of the selection signals $BS_1$ and $BS_2$ respectively. Note that, to be more accurate, in a state of mirror symmetry, the placement of the selection signals $BS_3$ and $BS_4$ is the reverse of the placement of the selection signals $BS_1$ and $BS_2$, however, it is also possible to switch the selection signal $BS_3$ with the selection signal $BS_4$, in which case, both blocks become perfectly mirror symmetrical. Other than this, the structure of the blocks $31_3$ and $31_4$ is the same as that of the blocks $31_1$ and $31_2$ with the only difference being that the selection signals $BS_5$ to $BS_8$ are supplied instead of the selection signals $BS_1$ to $BS_4$.

The sub bit lines $33_{L2}$ and $33_{R2}$ of the block $31_2$ and the sub bit lines $33_{L3}$ and $33_{R3}$ of the block $31_3$ are connected to the same contact 35, and the blocks $31_2$ and $31_3$ are mirror symmetrical to each other with the contact 35 as the boundary. This fact is the same for the block $31_1$ and the block $31_4$ and these blocks commonly share the contact 34 or the contact 36 with the block positioned either above or below them (not illustrated).

The word lines have the same layout as those shown in FIG. 4. For example, the word line loop $27_{11}$ is formed from two adjacent word lines running in the horizontal direction and wires running in the vertical direction for connecting both these word lines and has a configuration in which it is folded back just at the right end of the word line loop. Moreover, with the area between adjacent contacts taken as a unit, an n number of word line loops arranged in a concentric configuration are placed in a repeated pattern.

Next, a description will be given about the operation when data of the memory cell $M_{R22}$ in the block $31_2$, for example, is read in the above described structure. Firstly, only the word line activation signal $W_2$ supplied to the memory cell to be read is set to "L" from out of the word line activation signals $W_1$ to $W_n$, and the other word line activation signals are all set to "H". At the same time as this, only the selection signal $BS_3$ supplied to the selection transistor on the sub bit line in which the memory cell to be read is present is set to "H" from out of the selection signals $BS_1$ to $BS_8$, and the other selection signals are all set to "L". Note that the selection signals and word line activation signals supplied to each unit memory cell other than those shown in FIG. 5 are all set at "L". In addition to this, a predetermined positive voltage is applied to each of the main bit lines including the main bit line 32.

As a result of these settings, only the $TrQ_{R3}$ from among the block selection transistors within the blocks $31_1$ to $31_4$ is set to on and the other block selection transistors are all set to off. Note that all of the depletion type transistors including the $TrQ_{R4}$ connected in series to the $TrQ_{R3}$ are constantly set to on regardless of the selection signals $BS_1$ to $BS_8$. As a result of the above, the seven sub bit lines except for the sub bit line $33_{R2}$ are cut off from the main bit line 32 with all of the block selection transistors being in an off state. In contrast, all of the memory cells, apart from the memory cells $M_{L21}$, $M_{R21}$, $M_{L22}$, $M_{R22}$, $M_{L23}$, $M_{R23}$, $M_{L24}$, and $M_{R24}$ to which the word line activation signal $W_2$ is supplied, from among the memory cells within the blocks $33_1$ to $33_4$ are set to on regardless of whether each memory cell is a depletion type or not.

Looking at the sub bit line $33_{R2}$, the $TrQ_{R3}$, the $TrQ_{R4}$, the memory cells $M_{R12}$, $M_{R32}$ (not illustrated) to $M_{Rn2}$ are all in an on state. If the impurities in the memory cell $M_{R22}$ undergo ion implantation to form a depletion type transistor, the memory cell $M_{R22}$ is then always on. Therefore, the current flows along a path that starts from the main bit line 32 and passes through the contact 35 and, thereafter, from the diffused layer forming the sub bit line $33_{R2}$ through the $TrQ_{R4}$, the $TrQ_{R3}$, the memory cells $M_{Rn2}$, ..., $M_{R22}$, and $M_{R12}$ to the ground. In contrast, if the memory cell $M_{R22}$ is not a depletion type transistor, because the word line activation signal $W_2$ supplied to its own gate terminal is "L", the memory cell $M_{R22}$ is off and the current is unable to flow along the above described path. Because of this, the data of the memory cell $M_{R22}$ can be detected by the sense amplifier 18 or the sense amplifier 19 sensing whether or not current is flowing to the main bit line 32 through the ECC/Y selector 17 or the Y selector 16 shown in FIG. 3.

In the above operation, it is assumed that a leak or broken connection has occurred at a location (for example, at the point X in FIG. 5) nearer to the output end of the driver $25_2$ (see FIG. 4) than the sub bit line $33_{R2}$ in the word line loops (for example, the word line loop $27_{11}$) other than the word line loop $27_{21}$ to which the memory cell $M_{R22}$ is connected from among the word line loops within the block $31_2$ to which the memory cell $M_{R22}$ belongs. In this case, in order to read the memory cell $M_{R22}$, all of the memory cells on the sub bit line $33_{R2}$ except for the memory cell $M_{R22}$ must be on.

However, if, as in a semiconductor memory device according to the related art, the far end side of the word line is open and there is no folding back as in the word line loop $27_{11}$ according to the present embodiment, then even if the word line activation signal $W_1$ is "H", the voltage that is applied to the gate terminals of the memory cells $M_{L12}$ and $M_{R12}$ at the far end side of the point X ends up being below the threshold voltage and all these memory cells are placed in an off state.

As a result, if the memory cell $M_{R22}$ is not a depletion type, then, in a conventional structure, regardless of whether or not the current is expected to flow along the above described path, the memory cell $M_{R12}$ is placed in an off state by the fault on the word line and the current ends up being unable to flow along the above described path. Therefore, the sense amplifier ends up detecting data that is the exact opposite of the real data stored in the memory cell $M_{R22}$.

In contrast to this, because the word line loop $27_{11}$ is formed in the present embodiment, the "H" allocated to the word line activation signal $W_1$ is applied from the far end side of the word line loop $27_{11}$ to each of the gate terminals of the memory cells $M_{R12}$ and $M_{L12}$ via the respective gate terminals of the memory cells $M_{L11}$ and $M_{R11}$. Therefore, the gate terminal of the memory cell $M_{R12}$ exceeds the threshold voltage and is thereby placed in an on state, so that, even if the memory cell $M_{R22}$ is not a depletion type, the current flows along the above described path and a correct data reading can be performed.

Note that the above also applies when data is read from a memory cell other than the memory cell $M_{R22}$. Namely, only the word line activation signal connected to the memory cell being read needs to be set to "L" from among the word line activation signals $W_1$ to $W_n$, and only the selection signal supplied to the block selection transistor on the sub bit line that includes the memory cell being read needs to be set to "H" from among the selection signals $BS_1$ to $BS_8$.

(4) NOR Type Memory Cells

Next, a description will be given of a structural example when the present invention is applied to ROM that employs a NOR type memory cell structure with reference made to FIG. 6. In FIG. 6, only the structural elements that conform to FIG. 5 are shown and the word line activation signal, the selection signal, and the word line loop are exactly the same as those in FIG. 5. In addition, the fact that the unit memory cell is divided into four banks $41_1$ to $41_4$ that correspond to decode unit blocks is also the same. Note that it is normal practice to use the term "banks" when referring to NOR type memory cells and to use the term "blocks" when referring to NAND type memory cells and this terminology is followed in the present specification. It should be noted, however, that the banks referred to here are different in concept from the banks used in SDRAM (synchronous dynamic RAM) and the like.

Looking firstly at the area around the bank $41_1$, each bit line is formed from a main bit line 42 and a sub bit line $43_1$ connected to the main bit line 42. The main bit line 42 is the same as the main bit line 32 shown in FIG. 5 and the wiring mainly uses an aluminum wiring layer. In contrast, the sub bit line $43_1$ is mainly formed from an embedded diffused layer. The symbol 44 indicates a contact between the aluminum wire layer and the embedded diffused layer for connecting the main bit line 42 and the sub bit line $43_1$. The contacts 45 and 46 are the same as the contact 44.

Looking next at the interior of the bank $41_1$, n number of memory cells are provided on both the left and right of the sub bit line $43_1$. More specifically, the memory cells $M_{L11}$ to $M_{Ln1}$ are provided on the left side of the sub bit line $43_1$, while the memory cells $M_{R11}$ to $M_{Rn1}$ are provided on the right side of the sub bit line $43_1$. Word line activation signals $W_1$ to $W_n$ are supplied to the gate terminal of each memory cell, and two memory cells provided on the left and right sides sandwiching the sub bit line $43_1$ are selected simultaneously. The drain terminal of each memory cell is connected to the sub bit line $43_1$.

Further, each source terminal of the memory cells on the left hand side is commonly connected to the ground via the bank selection transistor $TrQ_1$. In the same way, each source terminal of the memory cells on the right hand side is commonly connected to the ground via the bank selection transistor $TrQ_2$. Note that the $TrQ_1$ and the $TrQ_2$ are selected respectively by the selection signals $BS_1$ and $BS_2$ supplied to their gate terminals and are used for reading the memory cells provided respectively on the left side and right side of the sub bit line $43_1$.

It should be noted that, in order to create the memory cell data, the memory cell has to be changed to on or off in accordance with the data when "H" is applied to the word line activation signal. To achieve this, it is sufficient to adjust the threshold voltage of the cell transistor higher or lower than the "H" of the word activation signal by performing ion implantation on the impurities in the cell transistor.

The structures of the banks $41_2$ to $41_4$ are all the same as the structure of the bank $41_1$, and these banks $41_2$ to $41_4$ are placed in exactly the same way as the blocks $31_1$ to $31_4$ in the NAND type ROM. Therefore, the sub bit line $43_2$ in the bank $41_2$ and the sub bit line $43_3$ in the bank $41_3$ are connected to the same contact 45, and the banks $41_2$ and $41_3$ are mirror symmetrical with the contact 45 as the boundary between the two. This fact is the same as for the bank $31_1$ and the bank $31_4$, and these banks commonly share the contact 44 or the contact 46 with the block positioned either above or below them (not illustrated).

A description will now be given of the operation when the data of the memory cell $M_{L22}$ in the bank $41_2$, for example, is read in the above structure. In this case, only the word line activation signal $W_2$ connected to the memory cell $M_{L22}$ is set to "H" from among the word line activation signals $W_1$ to $W_n$, and all the other word line activation signals are set to "L". In other words, the levels given to the word line activation signals are the exact opposite to those given for NAND type ROM.

At the same time as this, only the selection signal $BS_3$ supplied to the block selection transistor connected to the memory cell $M_{L22}$ is set to "H" from among the selection signals $BS_1$ to $BS_8$, and all the other selection signals are set to "L". Note that the fact that all other word line activation signals and selection signals supplied to each unit memory cell other than those shown in FIG. 6 are all set to "L", as well as the fact that a predetermined positive voltage is applied to each main bit line including the main bit line 42 are the same as in the case of NAND type ROM.

As a result of the above, only the $TrQ_3$ to which the selection signal $BS_3$ is supplied is turned on from among the bank selection transistors in the banks $41_1$ to $41_4$ and the other bank selection transistors are all turned off. Therefore, apart from the memory cells $M_{L12}$, $M_{L22}$, ..., $M_{Ln2}$, the source terminals of all of the memory cells are cut off from the ground by the respective corresponding bank selection transistors. In addition, all of the memory cells to which the word line activation signal $W_2$ is not supplied are set to off because of the "L" is supplied to the gate terminals thereof.

As a result of the above, the current is only able to flow along the path corresponding to the memory cell $M_{L22}$. If the threshold voltage of the memory cell $M_{L22}$ is at or less than the "H" of the word line activation signal $W_2$, the memory cell $M_{L22}$ placed in an on state. As a result, the current can flow along a path from the main bit line 42 via the contact 45 and from the embedded diffused layer forming the sub bit line $43_2$ through the memory cell $M_{L22}$ and the $TrQ_3$ to the ground.

In contrast to this, if the threshold voltage of the memory cell $M_{L22}$ is set to a value higher than the "H" of the word line activation signal $W_2$, the memory cell $M_{L22}$ is placed in an off state and the current is unable to flow along the above path. As a result of this, in the same way as for NAND type ROM, the data of the memory cell $M_{L22}$ can be detected by the sense amplifier 18 and the sense amplifier 19 sensing whether or not current is flowing in the main bit line 42.

In the above operation, it is assumed that a leak or broken connection has occurred on the word line (for example, at the point X in FIG. 6) nearer to the output end of the driver $25_2$ (see FIG. 4) than the connection point of the wiring of the word line activation signal $W_2$ and the gate terminal of the memory cell $M_{L22}$.

In this case, if the far end of the word line is open as in a semiconductor memory device according to the related art, then even if the word line activation signal $W_2$ is "H", the potential applied to the gate terminals of the memory cells $M_{L22}$ and $M_{R22}$ that are on the far end side of the point X is less than the threshold voltage. Therefore, if the threshold voltage of the memory cell $M_{L22}$ is not set higher than the "H" of the word line activation signal $W_2$, then, regardless of whether the memory cell $M_{L22}$ is expected to be placed in an on state and the current is expected to flow along the above path, due to the fault in the word line, the memory cell $M_{L22}$ ends up being placed in an off state and the current is unable to flow along the above path. Therefore, the sense amplifiers actually detect data that is the exact opposite of the data of the memory cell $M_{L22}$.

In contrast to this, because the word line loop $27_{21}$ is formed in the present embodiment, the potential of the "H" allocated as the word line activation signal $W_2$ is applied from the far end side of the word line loop $27_{21}$ to each of the gate terminals of the memory cells $M_{R22}$ and $M_{L22}$ via the vicinity of the respective gate terminals of the memory cells $M_{L21}$ and $M_{R21}$. Therefore, if the threshold voltage of the memory cell $M_{L22}$ is set below the "H" of the word line activation signal $W_2$, the memory cell $M_{L12}$ is placed in an on state so that the current flows along the above described path and a correct data reading can be performed.

Note that the above also applies when data is read from a memory cell other than the memory cell $M_{L22}$. Namely, only the word line activation signal connected to the memory cell being read needs to be set to "H" from among the word line activation signals $W_1$ to $W_n$, and only the selection signal supplied to the bank selection transistor connected to the source terminal of the memory cell being read needs to be set to "H" from among the selection signals $BS_1$ to $BS_8$.

(5) Layout

Next, the layout of the wiring pattern will be described with two examples provided.

Figure 7:
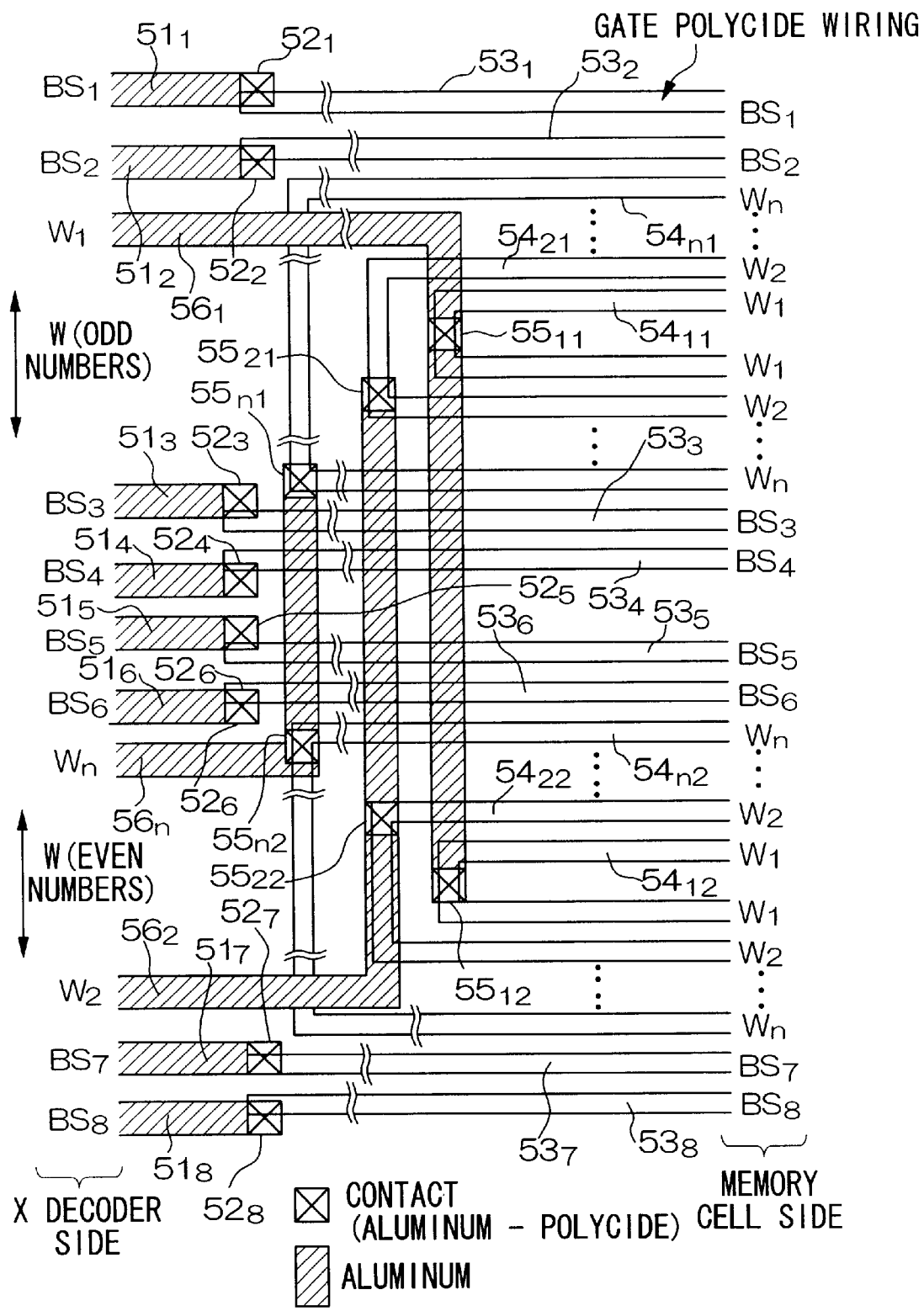
FIG. 7 is an explanatory diagram showing an example of the layout relating to the wiring from the output end of each driver to the input end of a unit memory cell 28 from the structure shown in FIG. 4.

Firstly, FIG. 7 shows an example of the layout in which the wiring of a word line activation signal supplied from the X decoder 13 side (see FIG. 3) and the wiring of two groups of word line activation signals supplied to the unit memory cell 28 side are connected by a single contact for each group. Note that, in FIG. 7, the portion from the output ends of the drivers $25_1$ to $25_n$ and the drivers $26_1$ to $26_8$ to the input ends of the unit memory cell 28 has been extracted from the structure shown in FIG. 4 and the layout thereof is shown. Accordingly, in FIG. 7, the left side is the side of the X decoder 13 and the right side is the side of the unit memory cell 28.

Here, the order of the selection signals $BS_1$ to $BS_8$ on the X decoder 13 side and the order of the word line activation signals $W_1$ to $W_n$ and the selection signals $BS_1$ to $BS_8$ on the unit memory cell 28 side are exactly the same as those shown in FIG. 4. In contrast, the order of the word line activation signals $W_1$ to $W_n$ on the X decoder 13 side is different to the order shown in FIG. 4. Specifically, odd numbered word line activation signals are input in the order $W_1$, $W_3$, ..., $W_{n-1}$ ($W_3$ and $W_{n-1}$ are not illustrated) between the selection signal $BS_2$ and the selection signal $BS_3$, and even numbered word line activation signals are input in the order $W_n$, ..., $W_4$, $W_2$ ($W_4$ is not illustrated) between the selection signal $BS_6$ and the selection signal $BS_7$.

Each of the selection signals $BS_1$ to $BS_8$ supplied from the X decoder 13 side is provided with aluminum wiring $51_1$ to $51_8$ as far as the respective contacts $52_1$ to $52_8$. Moreover, gate polycide wiring $53_1$ to $53_8$ is provided from the contacts $52_1$ to $52_8$ to the input ends of the unit memory cell 28.

If the word line activation signal is looked at, however, it will be seen that the gate polycide wiring $54_{11}$ to $54_{n1}$ forming word line loops extending towards the unit memory cell 28 side is arranged as rectangular loops in a concentric pattern in the area between the gate polycide wiring $53_2$ and the gate polycide wiring $53_3$. Of course, in FIG. 7, only the area of the folding portion at the left end of the rectangular loop is shown. The gate polycide wiring $54_{12}$ to $54_{n2}$ forming word line loops has exactly the same layout as the gate polycide wiring $54_{11}$ to $54_{n1}$ forming word line loops. Moreover, contacts $55_{11}$ to $55_{n1}$ and $55_{12}$ to $55_{n2}$ are placed respectively at the folding portions (namely, the wiring running in a vertical direction in the diagram) of the gate polycide wiring $54_{11}$ to $54_{n1}$ and $54_{12}$ to $54_{n2}$.

On the other hand, the wiring for the word line activation signal supplied from the X decoder 13 is provided such that upper and lower two word line loops are connected to each other. Namely, for the word line activation signal $W_1$, aluminum wiring $56_1$ extends towards the right in a horizontal direction, then is bent at a 90 degree angle in a clockwise direction at the position where the contact $55_{11}$ and the contact $55_{12}$ are placed, it then extends downwards in a vertical direction and is connected to the gate polycide wiring $54_{11}$ at the contact $55_{11}$, and then continues on downwards in a vertical direction and is connected to the gate polycide wiring $54_{12}$ at the contact $55_{12}$.

For the word line activation signal $W_2$, aluminum wiring $56_2$ extends towards the right in a horizontal direction, then is bent at a 90 degree angle in a counter clockwise direction at the position where the contact $55_{21}$ and the contact $55_{22}$ are placed, it then extends upwards in a vertical direction and is connected to the gate polycide wiring $54_{22}$ at the contact $55_{22}$, and then continues on upwards in a vertical direction and is connected to the gate polycide wiring $54_{21}$ at the contact $55_{21}$. Moreover, for the word line activation signal $W_n$, for example, aluminum wiring $56_n$ extends towards the right in a horizontal direction, then is bent at a 90 degree angle at the position where the contact $55_{n1}$ and the contact $55_{n2}$ are placed, it is then connected to the gate polycide wiring $54_{n2}$ at the contact $55_{n2}$, and then continues upwards in a vertical direction and is connected to the gate polycide wiring $54_{n1}$ at the contact $55_{n1}$.

Figure 8:
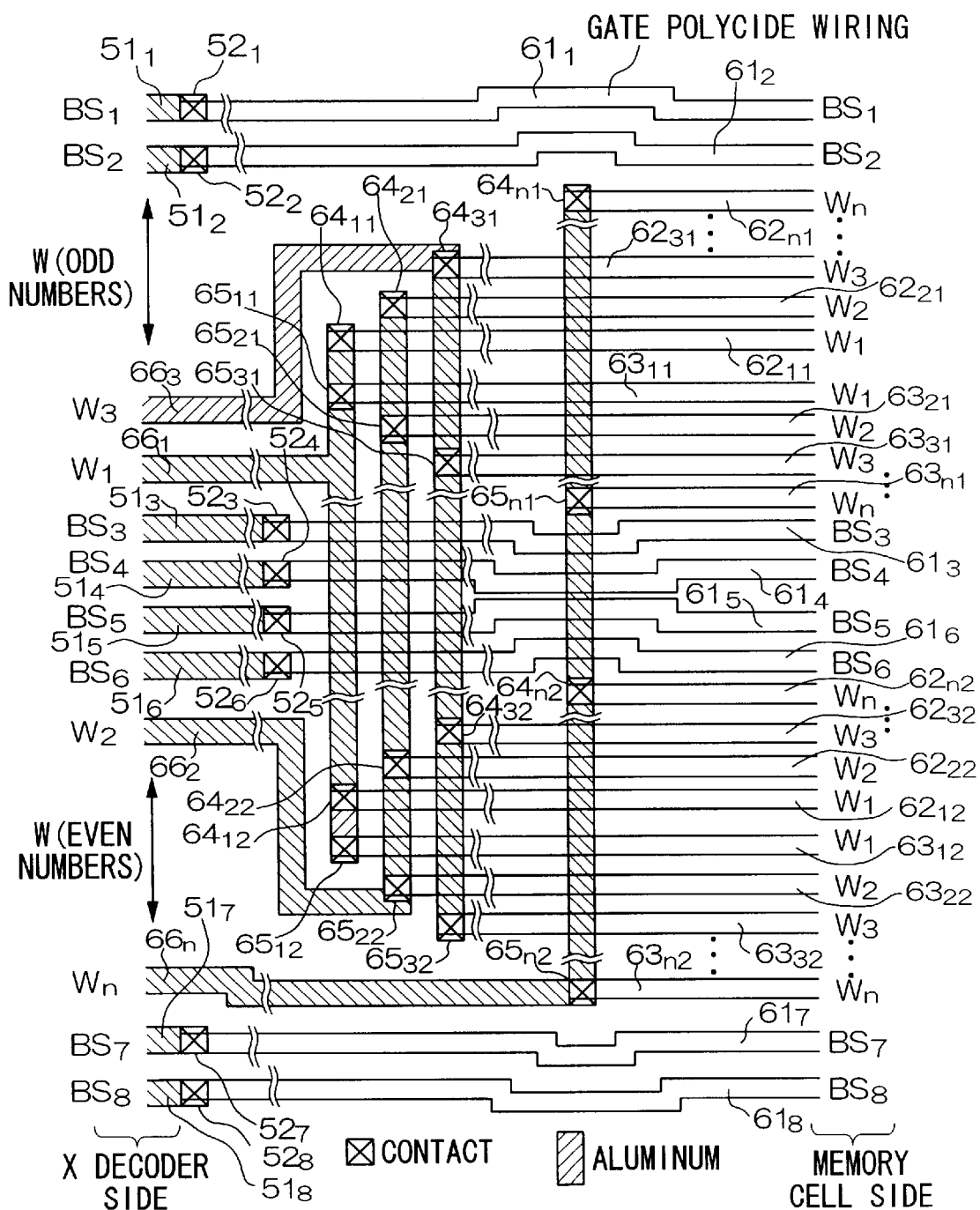
FIG. 8 is an explanatory diagram showing another example of the layout relating to the wiring from the output end of each driver to the input end of a unit memory cell 28 from the structure shown in FIG. 4

FIG. 8 shows an example of the layout in which the wiring of a word line activation signal supplied from the X decoder 13 side and the wiring of two groups of word line activation signals supplied to the unit memory cell 28 side are connected by two contacts for each group. Note that, in FIG. 8, the same descriptive symbols are allocated to the same wiring shown in FIG. 7.

In FIG. 8 as well, the left side is the side of the X decoder 13 and the right side is the side of the unit memory cell 28. The order of the selection signals $BS_1$ to $BS_8$ on the X decoder 13 side and the order of the word line activation signals $W_1$ to $W_n$ and the selection signals $BS_1$ to $BS_8$ on the unit memory cell 28 side are exactly the same as the orders shown in FIG. 7.

In contrast, the order of the word line activation signals $W_1$ to $W_n$ on the X decoder 13 side is different to the order shown in FIG. 7. Namely, odd numbered word line activation signals are input in the order $W_{n-1}, \ldots, W_3, W_1$ ($W_{n-1}$ is not illustrated) (i.e. in the opposite order to that shown in FIG. 7) between the selection signal $BS_2$ and the selection signal $BS_3$, and even numbered word line activation signals are input in the order $W_2, \ldots, W_n$ (i.e. in the opposite order to that shown in FIG. 7) between the selection signal $BS_6$ and the selection signal $BS_7$.

Each of the selection signals $BS_1$ to $BS_8$ supplied from the X decoder 13 side is provided, in the same way as in FIG. 7, with aluminum wires $51_1$ to $51_8$ as far as the respective contacts $52_1$ to $52_8$. Moreover, also in the same way as in FIG. 7, gate polycide wires $61_1$ to $61_8$ is provided from the contacts $52_1$ to $52_8$ to the unit memory cell 28. However, in this layout example, because the contacts $64_{n1}$, $65_{n1}$, $64_{n2}$, and $65_{n2}$, which are described below, are provided, the gate polycide wires $61_1$ to $61_8$ are detoured around the area of these contacts for the amount of the surface area necessary for the provision of the contacts.

A description will now be given of the word line activation signals. Although word line loops extending towards the unit memory cell 28 side are wired as an electrically rectangular loop in a concentric configuration, physically, they do not form a loop in the same wiring layer. Namely, in contrast to the wiring of the word line loop only being provided in the gate polycide wiring layer in FIG. 7, the folding portions at the left end of each word line loop shown in FIG. 7 is replaced in FIG. 8 with aluminum wiring. In other words, each word line loop is formed from two gate polycide wires running in the horizontal direction and one aluminum wire running in the vertical direction for connecting the left ends of these gate polycide wires.

Therefore, in the area bounded by the gate polycide wires $61_2$ to $61_3$, the gate polycide wires $62_{n1}$ to $62_{11}$ and $63_{11}$ to $63_{n1}$ run in this order in the horizontal direction. In the same way, in the area bounded by the gate polycide wires $61_6$ to $61_7$, the gate polycide wires $62_{n2}$ to $62_{12}$ and $63_{12}$ to $63_{n2}$ run in this order in the horizontal direction. In addition, the contacts $64_{n1}$ to $64_{11}$, $65_{11}$ to $65_n1$, $64_{n2}$ to $64_{12}$, and $65_{12}$ to $65_{n2}$ are placed respectively at the left ends of the gate polycide wires $62_{n1}$ to $62_{11}$, $63_{11}$ to $63_{n1}$, $62_{n2}$ to $62_{12}$, and $63_{12}$ to $63_{n2}$.

On the other hand, the word line activation signals supplied from the X decoder 13 side are wired such that the left ends of four word lines comprising an upper group and a lower group are connected for each group, Namely, in the case of the word line activation signal $W_1$, the aluminum wire $66_1$ extends to the right in the horizontal direction then, at the position where the contacts $64_{11}$, $65_{11}$, $64_{12}$, and $65_{12}$ are placed, bends at 90 degrees in both the up and down directions so as to form a T shape wiring pattern. The wire that extends upwards in the vertical direction connects with the gate polycide wire $63_{11}$ at the contact $65_{11}$ and then continues to extend upwards in the vertical direction so as to connect with the gate polycide wire $62_{11}$ at the contact $64_{11}$.

By employing this type of wiring pattern, an electrical loop is formed by the gate polycide wire $62_{11}$, the gate polycide wire $63_{11}$, the aluminum wire $66_1$, the contact $64_{11}$, and the contact $65_{11}$. Moreover, the wire of the aluminum wire $66_1$ that extends downwards in the vertical direction connects with the gate polycide wire $62_{12}$ at the contact $64_{12}$ and then continues to extend downwards in the vertical direction so as to connect with the gate polycide wire $63_{12}$ at the contact $65_{12}$, thereby forming the electrical loop of the word line activation signal $W_1$ in the same way.

The remaining odd numbered word line activation signals are the same as the word line activation signal $W_1$ and only the manner of winding is different from the word line activation signal $W_1$. For example, in the case of the word line activation signal $W_3$, the aluminum wire $66_3$ extends to the right in a horizontal direction then bends 90 degrees in a counter clockwise direction and extends vertically in an upward direction. It then bends 90 degrees in a clockwise direction at the position where the contact $64_{31}$ is placed and extends to the right in a horizontal direction as far as the contact $64_{31}$. After connecting with the gate polycide wire $62_{31}$, it bends 90 degrees in a clockwise direction and extends downward in a vertical direction so as to connect sequentially at the contacts $65_{31}$, $64_{32}$, and $65_{32}$ with the gate polycide wires $63_{31}$, $62_{32}$, and $63_{32}$.

In contrast, in the case of the even numbered word line activation signal $W_2$, the aluminum wire $66_2$ is substantially mirror symmetrical with the above aluminum wire $66_3$. Namely, the word line activation signal $W_2$ extends firstly to the right in a horizontal direction then bends 90 degrees in a clockwise direction and extends vertically in an downward direction. It then bends 90 degrees in a counter clockwise direction at the position where the contact $65_{22}$ is placed and extends to the right in a horizontal direction as far as the contact $65_{22}$. After connecting with the gate polycide wire $63_{22}$, it bends 90 degrees in a counter clockwise direction and extends upward in a vertical direction so as to connect sequentially at the contacts $64_{22}$, $65_{21}$, and $64_{21}$ with the gate polycide wires $62_{22}$, $63_{21}$, and $62_{21}$.

For the word line activation signals on the even number side other than this, for example, the word line activation signal $W_n$ extends to the right in a horizontal direction as far as the contact $65_{n2}$. After connecting with the gate polycide wire $63_{n2}$, it bends 90 degrees in a counter clockwise direction and extends upward in a vertical direction so as to connect sequentially at the contacts $64_{n2}$, $65_{n1}$, and $64_{n1}$ with the gate polycide wires $62_{n2}$, $63_{n1}$, and $62_{n1}$. By using this structure, two electrical word line loops are formed for each word line activation signal in the same way as for the odd numbered word line activation signals and these two word line loops are connected by aluminum wires running in the vertical direction.

Note that, if a comparison of the layout in FIG. 7 and the layout in FIG. 8 is made, in the layout in FIG. 8, two contacts are provided for each single word line loop, while in FIG. 7, only half of this number need be used so that only one contact is provided for each single word line loop. Accordingly, the layout shown in FIG. 7 is superior in that the number of contacts can be reduced and has the advantage that the surface area can be reduced by the corresponding amount of reduced contacts.

In addition to this, in the layout in FIG. 8, the aluminum wires $66_2$ and $66_3$ are bent in the manner described above, however, this bending is not present in FIG. 7. Because the smallest wire width of aluminum wire is still larger than the smallest wire width of gate polycide wire, it is possible to reduce the size in the vertical direction somewhat using the layout in FIG. 7 in comparison with the layout in FIG. 8.

Furthermore, while the folding such as that of the aluminum wires $66_2$ and $66_3$ is required in the layout shown in FIG. 8 in the horizontal direction, this folding is not needed in the layout of FIG. 7. Therefore, it is also possible to reduce the size in the horizontal direction somewhat using the layout in FIG. 7 in comparison with the layout in FIG. 8.

Where the layout in FIG. 8 is superior, however, is in the fact that because the word wire groups arranged at the top and bottom are connected together by low resistance metal wires, it is possible to reduce the resistance value from the output end of driver 1 to the near end memory cell to the minimum. As a result, it is possible to make the length of the word line longer than that in the layout of FIG. 7 and thus to increase the number of memory cells connected to the word line. Moreover, according to the layout in FIG. 8, because the resistance value to the position of the leak is reduced, the voltage drop at the leak position is reduced. Therefore, the merit of the layout of FIG. 8 is that the number of memory cells that are unable to be read is less than in the layout of FIG. 7 and the yield can be improved.

Figure 9:
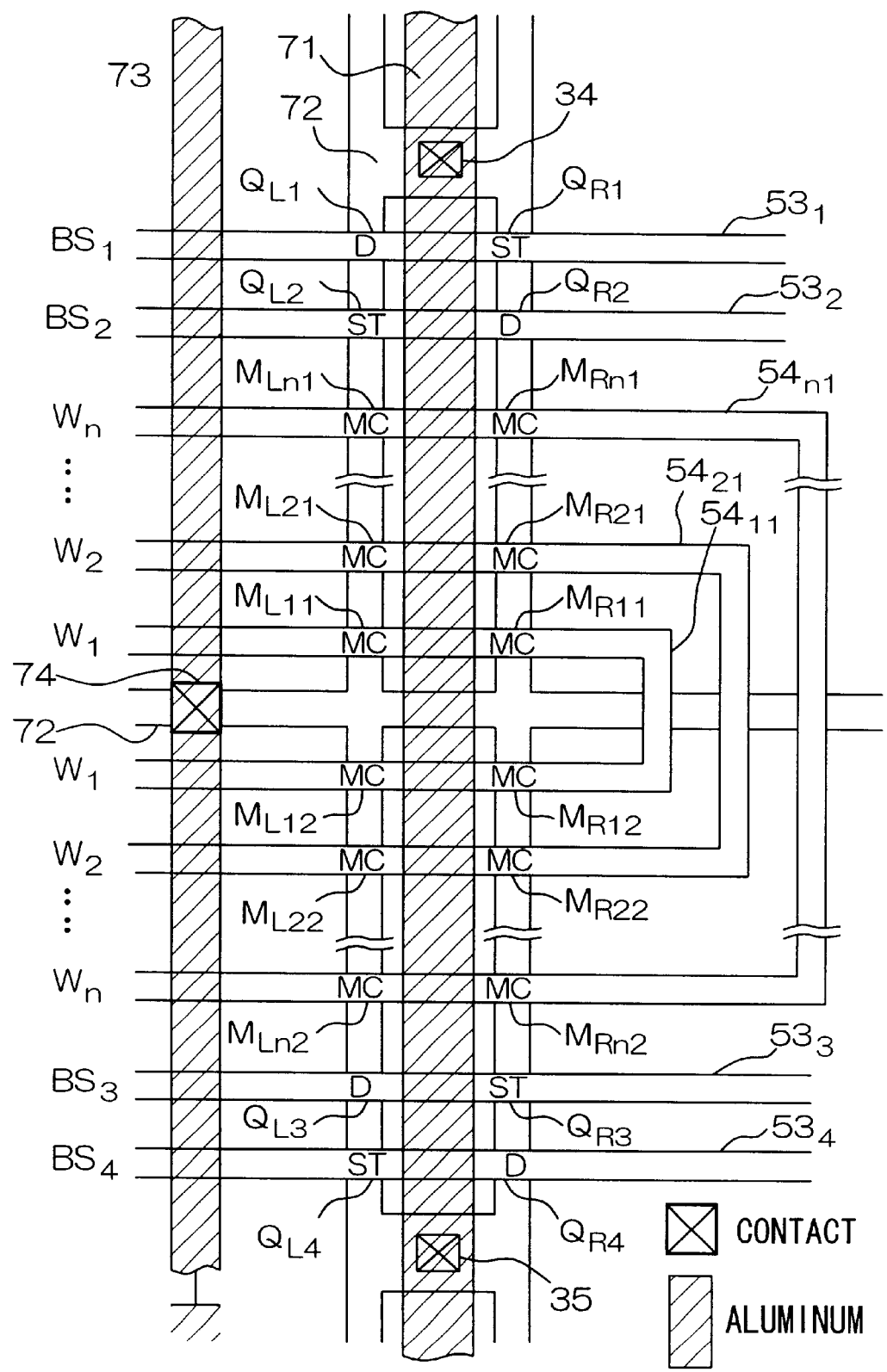
FIG. 9 is an explanatory diagram showing the layout corresponding to the NAND type memory cell structure shown in FIG. 5.

Next, FIG. 9 shows the layout of the ROM of the NAND type memory cell structure shown in FIG. 5 past the right hand end of the layout shown in FIG. 7. Therefore, in FIG. 9, the same structural elements and signal names as are shown in FIGS. 5 or 7 are given the same descriptive symbols. Moreover, in FIG. 9, only the portion between the contact 34 and the contact 35 is extracted from the structure shown in FIG. 5, however, the portion between the contact 35 and the contact 36 is the same as the layout shown in FIG. 9.

Firstly, the symbols D, MC, and ST indicate respectively the depletion type transistor, the memory cell, and the block selection transistor referred to in the description of FIG. 5. Next, the aluminum wire 71 is the wiring pattern of the main bit line 32 shown in FIG. 5. The diffused layer 72 forms the sub bit lines $33_{L1}$ and $33_{R1}$ shown in FIG. 5 and, as is shown in the diagram, is formed from a ladder shaped pattern extending in the vertical direction and a pattern extending to the left and right from the area of the center of the ladder shaped pattern.

Contacts 34 and 35 for connecting the aluminum wire 71 (the main bit line) and the diffused layer 72 (the sub bit line) are placed respectively at the portion of the rung portions of the ladder shaped pattern that is positioned above the selection signal $BS_1$ and below the selection signal $BS_4$. Next, the symbol 73 indicates an aluminum wire connected to the ground that runs in the vertical direction so as to intersect the pattern of the diffused layer 72 that extends to the left and right in the central area. A contact 74 for connecting the aluminum wire 73 and the diffused layer 72 to each other is placed at a position where the aluminum wire 73 intersects with the diffused layer 72.

Next, the gate polycide wires $54_{11}, 54_{21}, \ldots, 54_{n1}$ shown in FIG. 7 are mirror symmetrical in the vertical direction with the pattern of the diffused layer 72 extending in the horizontal direction as a boundary. Moreover, the left end portions of these gate polycide wires are connected to the right end portions of the gate polycide wires $54_{11}, 54_{21}, \ldots, 54_{n1}$ shown in FIG. 7 and these form rectangular word line loops arranged in a concentric configuration. Other than these, the gate polycide wires $53_1$ to $53_4$ are a pattern for supplying the supplying the selection signals $BS_1$ to $BS_4$ and the left ends of these are connected to the right ends of the gate polycide wires $53_1$ to $53_4$ shown in FIG. 7.

Note that there is no special depiction of the layout for the NOR type memory cell structure shown in FIG. 6, however, the layout of the word line loop which is the feature of the present invention is the same as that shown in FIG. 9 for a NOR type memory cell structure as well.

As described above, in the present embodiment, using an already existing word line within a memory cell array, the word line is driven in two directions, namely, from both the far end side and the near end side of the word line. Therefore, the problem of the reading of the memory cell not being possible because of faults in the word line is solved. Moreover, because there is absolutely no need for extra wiring other than the wiring for the folding back at the far end side of the word line, it is possible to redress faults in the word line with only a slight increase in the surface area.

Second Embodiment

Figure 10:
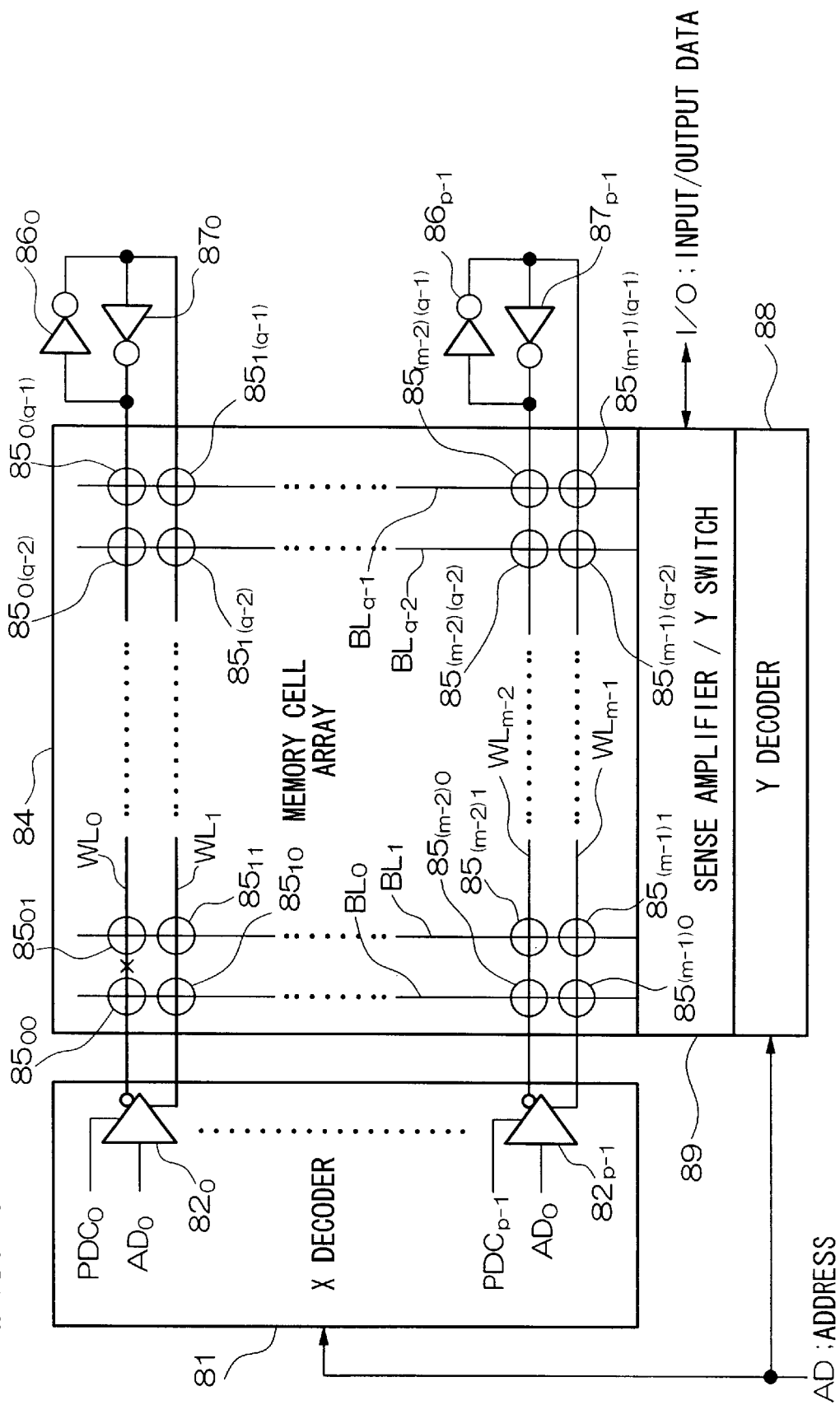
FIG. 10 is a block diagram showing the structure of DRAM according to the second embodiment of the present invention.

In the semiconductor memory device according to this embodiment of the present invention, the present invention is applied to DRAM. A block diagram of the overall structure thereof is shown in FIG. 10. In FIG. 10, the X decoder 81 decodes row addresses in the address AD, and any one of the m number of word lines $WL_0$ to $WL_{m-1}$ is driven and activated. Note that the word lines $WL_0, WL_1, WL_{m-1}$ are activated when their respective$_{row}$ addresses are 0, 1, ..., m−1.

To describe in more detail, the X decoder 81 is provided with p number of drivers $82_0$ to $82_{p-1}$ for driving any two adjacent word lines. Note that, in order to simplify the description, if the number of word lines m is taken as a multiple of 2, then the number of drivers p becomes (m/2). Each driver is provided with inverted output and non-inverted output and the lowest order bit $AD_0$ of the address AD and predecode signals obtained by predecoding each bit apart from the lowest order bit $AD_0$ of the address AD are input into each driver.

Here, for example, when the value apart from the lowest order bit of the address AD is 0 (i.e. the address AD is 0 or 1), the predecode signal $PDC_0$ becomes "H" and, at all other times, becomes "L". In this description, it will be assumed that "H" has been input as the predecode signal $PDC_0$. In this case, if the value of the lowest order bit $AD_0$ is "0"B (wherein B indicates a binary number), the driver $82_0$ activates the word line $WL_0$ connected to the inverted output and makes the word line $WL_1$ connected to the non-inverted output inactive. If, however, the value of the lowest order bit $AD_0$ is "1"B, the driver $82_0$ makes the word line $WL_0$ inactive and activates the word line $WL_1$.

If, however, "L" is input as the predecode signal $PDC_0$, then, in this case, the word lines driven by the other drivers apart from the driver $82_0$ are activated. Therefore, the driver $82_0$ makes both the word lines $WL_0$ and $WL_1$ inactive regardless of the value of the lowest order bit $AD_0$. This applies for the other predecode signals as well and, for example, when the address AD is m−2 or m−1, then the predecode signal $PDC_{p-1}$ becomes "H". When the predecode signal $PDC_{p-1}$ is "H", then when the lowest order bit $AD_0$ is 0 or "1", the driver $82_{p-1}$ only activates the respective word lines $WL_{m-2}$ or $WL_{m-1}$.

Next, the symbol O located on each word line at the points of intersection with the q number of bit lines $BL_0$ to $BL_{q-1}$ indicates each individual memory cell forming the memory cell array 84. For example, the memory cells $85_{00}, 85_{01}, \ldots, 85_{0(q-2)}, 85_{0(q-1)}$ are placed at the intersection points of the bit lines $BL_0$ to $BL_{q-1}$ on the word line $WL_0$. Memory cells are placed in the same way on all the other word lines as well.

Next, an inverting driver $86_0$ and an inverting driver $87_0$ are provided so as to correspond to the driver $82_0$ at a position (at the far end side of the word line) facing the X decoder 81 on the other side of the memory cell array 84. Of these two, when there is a leak or a broken connection on the word line $WL_1$, the inverting driver $86_0$ supplies a charge to the word line $WL_1$ from the far end side as seen from the driver $82_0$ to the location of the fault. In contrast, when there is a leak or a broken connection on the word line $WL_0$, the inverting driver $87_0$ supplies a charge to the word line $WL_0$ from the far end side as seen from the driver $82_0$ to the location of the fault.

By folding back the adjacent word lines $WL_0$ and $WL_1$ at the far end side as seen from the X decoder 81 by the inverting drivers $86_0$ and $87_0$, it is possible to form the word lines in a loop configuration in the same way as in the first embodiment. Moreover, word line loops are formed by providing inverting drivers having the same function as the inverting driver $86_0$ and the inverting driver $87_0$ for each driver other than the driver $82_0$. For example, the inverting driver $86_{p-1}$ and the inverting driver $87_{p-1}$ are provided so as to correspond to the driver $82_{p-1}$. Note that, as described above, when the predecode signals $PDC_0$ to $PDC_{p-1}$ are "L", the respective drivers $82_0$ to $82_{p-1}$ make the two word lines that they themselves drive inactive. To correspond to this, when, for example, the predecode signal $PDC_0$ becomes "L", both the inverting driver $86_0$ and the inverting driver $87_0$ forcibly change their output to "L". The inverting drivers other than these have the same structure.

Next, the Y decoder 88 decodes the column addresses from the addresses AD and validates the column selection signal corresponding to the particular bit line specified by the relevant column address from among the bit lines $BL_0$ to $BL_{q-1}$. Next, in addition to the sense amplifier built into the sense amplifier/Y switch 89 being used to sense the data of the memory cells read on the bit lines $BL_0$ to $BL_{q-1}$, it is also used for the rewriting that accompanies the reading and for the writing to the memory cells requested from the outside. Moreover, the Y switch (i.e. the column switch) built into the sense amplifier/Y switch 89 connects a particular bit line to an input/output buffer (not illustrated) in accordance with the column selection signals output from the Y decoder 88, and, in the case of a reading, outputs to the outside memory cell data as input/output data I/O, and, in the case of a writing, supplies to the bit line data provided from the outside to the input/output data I/O.

Next, the operation that is performed when a malfunction occurs on a word line in DRAM having the above-described structure will be described. Note that, because access to a memory cell is similarly not possible for both reading and writing when a malfunction occurs on a word line, only the operation performed for a reading is described below.

Firstly, in the case of performing a reading from a memory cell connected to the word line $WL_0$, it will be assumed that a malfunction such as a leak or broken connection has occurred at the point X on the word line. In this case, in addition to the predecode signal $PDC_0$ becoming "H", the lowest order bit $AD_0$ becomes "0"B. Therefore, the driver $82_0$ supplies a sufficiently high voltage for the activation of the word line to the word line $WL_0$ and supplies a voltage lower than this (for example, ground potential) to the word line $WL_1$.

In this case, although reading becomes possible for the memory cell $85_{00}$, because of the above fault in the word line, it is not possible to read the remaining memory cells $85_{01}, \ldots, 85_{0(q-1)}$ with only the output voltage from the driver $82_0$. However, because the input end of the inverting driver $87_0$ is a low voltage, the inverting driver $87_0$ is able to apply high voltage from the far end side of the word line $WL_0$. Therefore, voltage higher than the threshold voltage is applied to the gate terminals of the memory cells $85_{01}, \ldots, 85_{0(q-1)}$ as well, resulting in these memory cells also being able to be read. Note that, the reading operation after this is exactly the same as for existing DRAM so a description thereof is omitted here.

In the case of performing a reading from a memory cell connected to the word line $WL_1$, it will be assumed that a malfunction such as a leak or broken connection (not illustrated) has occurred between the memory cell $85_{1(q-2)}$ and the memory cell $85_{1(q-1)}$ on the word line. Note that, at this time, it is assumed that no leak or broken connection has occurred at the point X in FIG. 10 on the word line $WL_0$. In this case, in addition to the predecode signal $PDC_0$ becoming "H", the lowest order bit $AD_0$ becomes "1"B. Therefore, the driver $82_0$ supplies a high voltage to the word line $WL_1$ and supplies a low voltage to the word line $WL_0$. As a result, although reading of the memory cells $85_{10}, \ldots, 85_{1(q-2)}$ becomes possible, because of the above fault in the word line, it is not possible to read the memory cell $85_{1(q-1)}$ using only the output voltage from the driver $82_0$.

However, in this case, because the word line $WL_0$ has been made inactive and the input of the inverting driver $86_0$ is set at a low voltage, the inverting driver $86_0$ is able to apply high voltage from the far end side of the word line $WL_1$. Therefore, voltage higher than the threshold voltage is applied to the gate terminals of the memory cell $85_{1(q-1)}$, resulting in a correct reading being made possible. Note that, word lines other than the above described word lines $WL_0$ and $WL_1$ are read in the same way enabling the reading of a memory cell that had been rendered impossible by a fault in the word line to be properly carried out.

As has been described above, in the present embodiment as well, using an already existing word line within a memory cell array, the word line is driven in two directions, namely, from both the far end side and the near end side of the word line. Therefore, the problem of the reading of the memory cell not being possible because of faults in the word line is solved. Note that, the description hitherto has been of when the present invention is applied to DRAM, however, it is also possible to apply the present invention to SRAM (static RAM) and the like because only small points such as the specific structure of the memory cell and the specific structure of the sense amplifier/Y switch are different.

Note also that, as regards the information of faulty addresses that is unable to be read, by storing substitute addresses as well the faulty addresses in a memory controller (not illustrated) or the like, and replacing the substitute addresses for the faulty addresses when these faulty addresses are accessed, it is possible to read and write normal data. Moreover, in the same way as in the first embodiment, it is also possible to correct the data by providing an ECC storage area and an ECC circuit in the DRAM circuit.

It should also be noted that the following structure might also be considered in addition to the above described embodiments as a structure for driving a word line from the far end side. Namely, in addition to each driver driving a word line from the near end side of that word line, in the same way as for existing DRAM and the like, it is possible to provide an additional wire connecting the output of each driver and the far end side of the relevant word line adjacent to the relevant word line and to form a loop with the word line and the additional wire. By using this structure, it becomes possible for each driver to supply a charge from both the near end side and the far end side of the word line. Naturally, by employing this type of structure, the same number of additional wires as the number of word lines needs to be provided separately which is slightly disadvantageous in view of the increase in the surface area. Accordingly, as a solution for redressing faults in a word line in DRAM and the like in which miniaturization is advanced, it is more preferable if the methods described in detail above are used.

Moreover, another structure can be considered in which there is no folding back at the far end sides of the word lines as in the present invention, but instead drivers are provided at both the near end side and far end side of a word line and the same word line is driven from both the near end side and the far end side. Naturally, it is also necessary to provide an X decoder at the far end side as well in order to control the driver placed at the far end side if this type of structure is employed. In other words, in addition to an extra decode circuit being required at the far end side as well, wiring for supplying an address AD to the decode circuit is also required. Therefore, because this is slightly disadvantageous in view of the increase in the surface area, in a semiconductor memory device such as DRAM and the like in which miniaturization is advanced, it is more preferable if the methods described in detail above are used.

What is claimed is:

1. A semiconductor memory device comprising:
   a drive section for supplying a drive signal to a word line and driving memory cells connected to the word line; and
   a folding section for folding back the drive signal supplied to any particular word line by the drive section at a far end side of the word line as seen from the drive section to at least one other word line.

2. The semiconductor memory device according to claim 1, wherein the folding section is provided with wiring for connecting the particular word line and the other word line, and the wiring of the folding section is formed using an identical wiring layer to the particular word line and the other word line.

3. The semiconductor memory device according to claim 1, wherein the particular word line and the other word line form a word line connected in a loop configuration by the folding section.

4. The semiconductor memory device according to claim 3, wherein a plurality of word lines connected in a loop configuration are placed concentrically to each other.

5. The semiconductor memory device according to claim 1, further comprising:
   a memory cell array, in which a plurality of the memory cells are provided, for storing data to be output to the outside and error correction codes for detecting and correcting errors existing in the data; and
   an error correction section for detecting, based on the data and the error correction codes read from the memory cell array, whether or not errors are present in the data and outputting to the outside data in which the errors have been corrected.

6. The semiconductor memory device according to claim 1, wherein the drive section supplies identical drive signals to a plurality of word lines and thereby simultaneously drives memory cells connected to this plurality of word lines, and the folding section folds back at the far end side either a portion of the plurality of word lines or all of the word lines.

7. The semiconductor memory device according to claim 6, wherein a selection signal for selecting any one of the plurality of memory cells simultaneously driven by the identical drive signals is supplied to the memory cell array, and the folding section folds the drive signals from the particular word line to the other word line such that they do not intersect the selection signal.

8. The semiconductor memory device according to claim 1, wherein the drive section supplies drive signals that are the inversion of each other to the particular word line and the other word line, and the folding section folds back to the other word line a drive signal obtained by inverting the drive signal output from the particular word line.

9. The semiconductor memory device according to claim 1, wherein the folding section folds back at the far end side among a plurality of adjacent word lines.

* * * * *